(12) United States Patent
Hashikura et al.

(10) Patent No.: US 8,654,528 B2
(45) Date of Patent: Feb. 18, 2014

(54) ELECTRIC CONNECTION BOX

(75) Inventors: Manabu Hashikura, Yokkaichi (JP);
Tatsuya Shimizu, Yokkaichi (JP);
Futoshi Nishida, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 477 days.

(21) Appl. No.: 11/984,084

(22) Filed: Nov. 13, 2007

(65) Prior Publication Data
US 2008/0117591 A1 May 22, 2008

(30) Foreign Application Priority Data

Nov. 16, 2006 (JP) ................................. 2006-310653
Jun. 19, 2007 (JP) ................................. 2007-161425

(51) Int. Cl.
*H05K 7/20* (2006.01)
*H05K 7/00* (2006.01)
*H05K 5/00* (2006.01)
*F28D 15/00* (2006.01)

(52) U.S. Cl.
USPC ...... 361/690; 361/694; 361/695; 361/679.46; 361/679.49; 361/728; 165/104.33; 174/50

(58) Field of Classification Search
USPC .............. 361/690, 694, 695, 679.46, 679.49, 361/728; 174/50; 165/104.33
See application file for complete search history.

(56) References Cited

U.S. PATENT DOCUMENTS

| | | | | |
|---|---|---|---|---|
| 3,940,665 A | * | 2/1976 | Seki .............................. | 361/692 |
| 4,055,725 A | * | 10/1977 | Boynton ....................... | 361/760 |
| 4,535,386 A | * | 8/1985 | Frey et al. .................... | 361/714 |
| 4,682,268 A | * | 7/1987 | Okano et al. .................. | 361/697 |
| 4,763,224 A | * | 8/1988 | Bentz et al. ................... | 361/704 |
| 4,858,069 A | * | 8/1989 | Hughes ......................... | 361/696 |
| 5,063,476 A | * | 11/1991 | Hamadah et al. ............. | 361/697 |

(Continued)

FOREIGN PATENT DOCUMENTS

| | | | |
|---|---|---|---|
| JP | 57-126198 | * | 8/1982 |
| JP | U-57-126198 | | 8/1982 |

(Continued)

OTHER PUBLICATIONS

Masaru Ishizuka, "A Thermal Design Approach for Natural Air Cooled Electronic Equipment Casings," *HTD*, vol. 303, 1995 National Heat Transfer Conference, vol. 1, ASME 1995, pp. 65-72.

(Continued)

*Primary Examiner* — Bradley Thomas
(74) *Attorney, Agent, or Firm* — Oliff PLC

(57) ABSTRACT

An electric connection box according to the present invention can include a circuit board having a first surface capable of mounting an electronic component, and a second surface defining a non-mounting surface, a case housing the circuit board, the circuit board oriented in a substantially vertical direction, a vertical inner wall surface of the case formed opposite the non-mounting surface of said circuit board, the vertical inner wall and the non-mounting surface of said circuit board defining a substantially vertical air ventilation path, a suction port positioned in the case and in communication with the ventilation path, an exhaust port positioned in the case above said suction port and in communication with the ventilation path, and a heat generating component in communication with the ventilation path.

20 Claims, 18 Drawing Sheets

(56) References Cited

U.S. PATENT DOCUMENTS

| | | | |
|---|---|---|---|
| 5,214,621 A * | 5/1993 | Maggelet et al. | 361/752 |
| 5,218,516 A * | 6/1993 | Collins et al. | 361/721 |
| 5,276,584 A * | 1/1994 | Collins et al. | 361/718 |
| 5,440,450 A * | 8/1995 | Lau et al. | 361/695 |
| 5,523,917 A * | 6/1996 | Searby | 361/679.48 |
| 5,789,704 A * | 8/1998 | Kawakita | 174/535 |
| 5,798,908 A * | 8/1998 | Herzberger et al. | 361/707 |
| 5,825,621 A * | 10/1998 | Giannatto et al. | 361/701 |
| 5,831,830 A * | 11/1998 | Mahler | 361/704 |
| 5,870,284 A * | 2/1999 | Stewart et al. | 361/699 |
| 5,880,932 A * | 3/1999 | Jelinger | 361/695 |
| 6,027,535 A * | 2/2000 | Eberle et al. | 361/690 |
| 6,115,250 A * | 9/2000 | Schmitt | 361/695 |
| 6,144,556 A * | 11/2000 | Lanclos | 361/695 |
| 6,226,182 B1 * | 5/2001 | Maehara | 361/695 |
| 6,269,003 B1 * | 7/2001 | Wen-Chen | 361/704 |
| 6,273,181 B1 * | 8/2001 | Matsui et al. | 165/46 |
| 6,370,023 B1 * | 4/2002 | Su | 361/679.48 |
| 6,373,697 B1 * | 4/2002 | Lajara et al. | 361/679.48 |
| 6,400,567 B1 * | 6/2002 | McKeen et al. | 361/695 |
| 6,459,577 B1 * | 10/2002 | Holmes et al. | 361/690 |
| 6,522,540 B2 * | 2/2003 | Sakaiya et al. | 361/697 |
| 6,545,872 B1 * | 4/2003 | Lonergan et al. | 361/719 |
| 6,643,131 B1 * | 11/2003 | Huang | 361/697 |
| 6,785,145 B1 * | 8/2004 | Wong | 361/752 |
| 6,870,738 B2 * | 3/2005 | Goebl | 361/719 |
| 6,906,920 B1 * | 6/2005 | Whitted | 361/695 |
| 6,980,432 B2 * | 12/2005 | Natsume et al. | 361/690 |
| 7,113,400 B2 * | 9/2006 | Nagata et al. | 361/690 |
| 7,179,097 B2 * | 2/2007 | Ishiguro et al. | 439/76.2 |
| 7,249,956 B2 * | 7/2007 | Ishiguro et al. | 439/76.2 |
| 7,256,993 B2 * | 8/2007 | Cravens et al. | 361/690 |
| 7,573,712 B2 * | 8/2009 | Wu et al. | 361/695 |
| 7,593,229 B2 * | 9/2009 | Shuy | 361/705 |
| 7,633,751 B2 * | 12/2009 | Shinotou et al. | 361/679.5 |
| 7,965,503 B2 * | 6/2011 | Yoder et al. | 361/692 |
| 2002/0149909 A1 * | 10/2002 | Konstad et al. | 361/687 |
| 2002/0191374 A1 * | 12/2002 | Yatougo et al. | 361/690 |
| 2004/0150951 A1 * | 8/2004 | Yatougo et al. | 361/690 |
| 2005/0168940 A1 * | 8/2005 | Askeland et al. | 361/687 |
| 2005/0174745 A1 * | 8/2005 | Higgins et al. | 361/765 |
| 2006/0056151 A1 * | 3/2006 | Hara et al. | 361/696 |
| 2006/0120043 A1 * | 6/2006 | Wolford et al. | 361/695 |
| 2006/0126289 A1 * | 6/2006 | Takenoshita et al. | 361/687 |
| 2006/0146499 A1 * | 7/2006 | Reents | 361/704 |
| 2006/0238980 A1 * | 10/2006 | Bhattacharyya et al. | 361/700 |
| 2008/0037222 A1 * | 2/2008 | Jha et al. | 361/709 |
| 2008/0101018 A1 * | 5/2008 | Long et al. | 361/695 |
| 2008/0232066 A1 * | 9/2008 | Wu et al. | 361/690 |
| 2008/0239634 A1 * | 10/2008 | Nakao et al. | 361/681 |

FOREIGN PATENT DOCUMENTS

| | | |
|---|---|---|
| JP | U-63-55733 | 4/1988 |
| JP | A-09-214158 | 8/1997 |
| JP | A-2000-036679 | 2/2000 |
| JP | A-2001-111273 | 4/2001 |
| JP | A-2001-197628 | 7/2001 |
| JP | A-2001-298290 | 10/2001 |
| JP | A-2002-341777 | 11/2002 |
| JP | A-2005-295724 | 10/2005 |
| JP | A-2006-019711 | 1/2006 |
| JP | A-2006-034010 | 2/2006 |

OTHER PUBLICATIONS

U.S. Appl. No. 11/984,083, filed Nov. 13, 2007 in the name of Tatsuya Shimizu et al.

U.S. Appl. No. 11/984,086, filed Nov. 13, 2007 in the name of Tatsuya Shimizu et al.

Office Action issued in JP Application No. 2007-161425 on May 19, 2011 (with English translation).

Office Action issued in CN Application No. 200710186945.7 on Mar. 3, 2011(with English translation).

Dec. 22, 2011 Office Action issued in Japanese Patent Application No. 2007-161425 (with translation).

* cited by examiner

ELECTRIC CONNECTION BOX

CROSS REFERENCE TO RELATED APPLICATION

This application claims priority from Japanese Patent Application No. 2006-310653 filed on Nov. 16, 2006 and Application No. 2007-161425 filed on Jun. 19, 2007. The entire content of these priority applications is incorporated herein by reference.

TECHNICAL FIELD

The disclosure relates to an electric connection box housing a circuit board in a case.

BACKGROUND

Conventionally, as an electric connection box, the one disclosed in Patent Document 1 (Japanese Unexamined Patent Application Publication No. 2006-19711) is known. The electric connection box is configured by housing a board for mounting a heat generating component in a casing. A metal heat collecting part is fixed to the above described board, and a cylindrical part exposed to an outside of the casing is fixed to the heat collecting part. A heat dissipation window is formed in an upper portion of the cylindrical part, and an intake window is formed in a lower portion.

In the above described electric connection box, heat generated from the heat generating component is transferred to the cylindrical part, which is exposed to the outside of the casing, through the heat collecting part from the board. The heat transferred to the cylindrical part is transferred to air flowing in from the intake window, and the air rises in the cylindrical part to flow out from the heat dissipation window, whereby the heat is dissipated to the outside of the casing.

However, according to the above described configuration, the cylindrical part is provided at the outside of the casing, and therefore, downsizing of the electric connection box cannot be achieved.

Thus, it is conceivable that downsizing of the electric connection box is achieved by omitting the cylindrical part and the heat generating from the heat generating component is dissipated to the outside of the casing by providing an air hole at a top and bottom of the casing. According to the configuration, external air flows toward the air hole at an upper portion from the air hole at a lower portion inside the casing, and therefore, it is expected that the heat generated from the heat generating component can be dissipated to the outside of the casing by the flow of the external air.

However, the shape of the casing is not always cylindrical, and the flow path of air becomes complicated due to electronic components on the circuit board housed in the casing. Therefore, it is feared that air does not flow smoothly in the casing and the heat of the heat generating component is confined within the casing.

SUMMARY

The present invention is completed based on the circumstances as described above, and has an object to provide an electric connection box which is downsized and enhanced in dissipation performance of heat from heat generating components.

An electric connection box according to the present invention can include a circuit board having a first surface capable of mounting an electronic component, and a second surface defining a non-mounting surface, a case housing the circuit board, the circuit board oriented in a substantially vertical direction, a vertical inner wall surface of the case formed opposite the non-mounting surface of said circuit board, the vertical inner wall and the non-mounting surface of said circuit board defining a substantially vertical air ventilation path, a suction port positioned in the case and in communication with the ventilation path, an exhaust port positioned in the case above said suction port and in communication with the ventilation path, and a heat generating component in communication with the ventilation path.

According to the present invention, the air flowing into the case from the suction port contacts a heat generating component placed in the ventilation path, and thereby, the heat generating from the heat generating component is transferred to the air. The air of which temperature rises by the heat has low density, rises in the ventilation path due to a so-called chimney effect, and flows outside the case from the exhaust port. Thereby, the heat generated from the heat generating component is dissipated to the outside of the case, and is not confined within the case. As a result, even if the electric connection box is downsized, the temperature of the inside of it can be prevented from becoming abnormally high.

BRIEF DESCRIPTION OF THE DRAWINGS

Illustrative aspects in accordance with the invention will be described in detail with reference to the following figures wherein.

DETAILED DESCRIPTION OF THE PREFERRED ILLUSTRATIVE ASPECTS

An illustrative aspect of the present invention will be described with reference to FIGS. 1 to 7. An electric connection box of the illustrative aspect is mounted between a battery (not shown) and on-vehicle electrical components (not shown) such as a lamp and a power window, and controls energization and deenergization of the on-vehicle electrical components. The electric connection box is configured by housing a circuit board 11 in a flat case 10. The electric connection box is used by being mounted to an interior of a car (not shown) in a vertical posture shown in FIG. 6, for example. The vertical posture means that the circuit board 11 is disposed inside the case 10 with a board face of the circuit board 11 in a vertical posture.

(Circuit Board)

Figure 7:
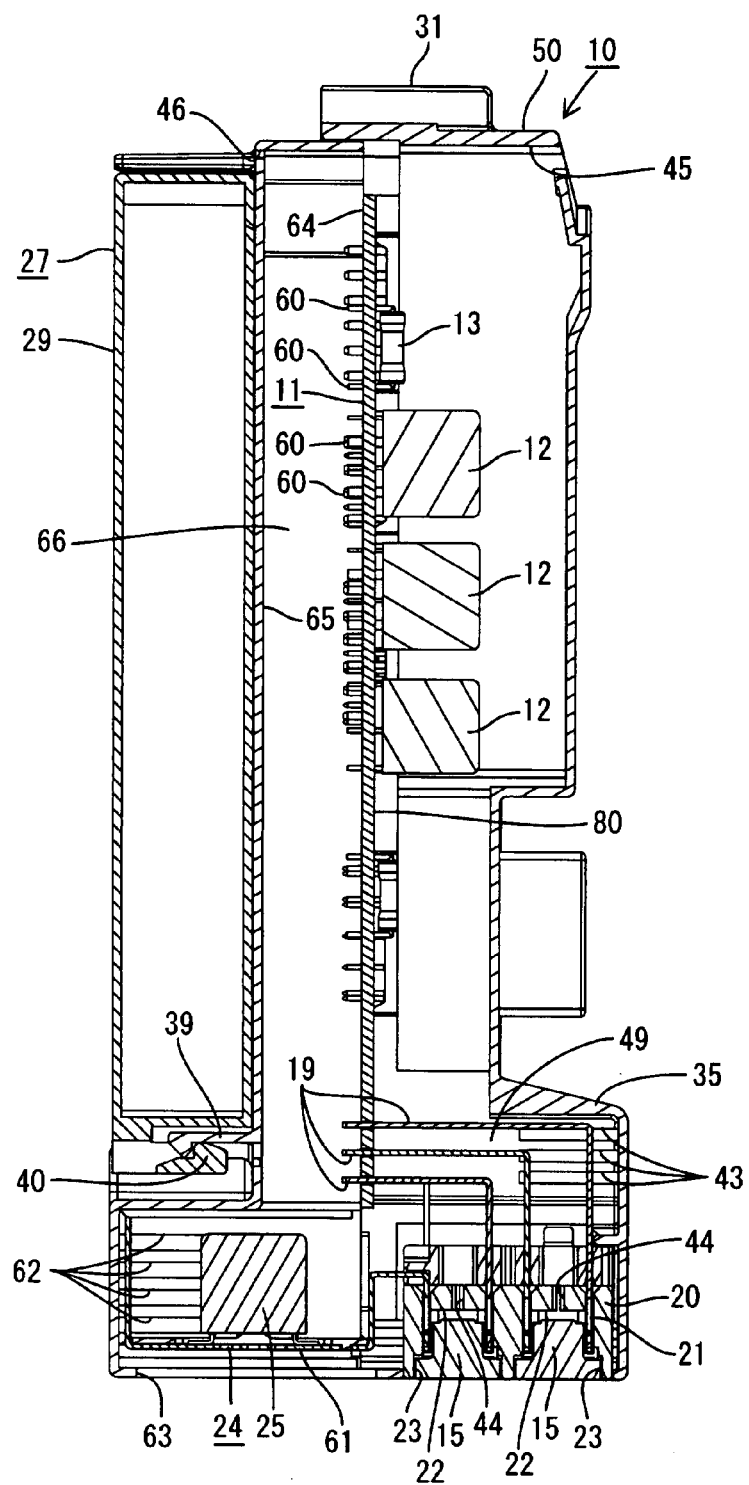
FIG. 7 is a sectional view taken along the line B-B in FIG. 3.

The circuit board 11 is in a substantially rectangular shape, and conductive paths (not shown) are formed on both surfaces of it by a printed wiring technique. In the circuit board 11, intermittent relays 12 (an example of the electronic component) which energizing and deenergizing the on-vehicle electrical components (not shown) intermittently used such as fog lamps and door locks are mounted on a surface (hereinafter, called a mounting surface 80) at a right side in FIG. 7. A resistor 13 (an example of the electronic component) for preventing back electromotive force of the intermittent relays 12 is mounted on the mounting surface 80 of the circuit board 11. Thereby, a surface at a left side of the circuit board 11 in FIG. 7 is made a non-mounting surface 64. Further, male tabs (an example of a connection terminal) 17 which connects to the connector 14 for connecting to an external circuit is mounted on the mounting surface 80 of the circuit board 11 via male tab pedestals 18.

Lead terminals (an example of a terminal) 60 of the intermittent relays 12 and the resistor 13 penetrate through the circuit board 11 from the mounting surface 80 side of the circuit board 11 to the non-mounting surface 64 side. The lead terminals 60 are soldered to through-holes (not shown) formed in the circuit board 11 and electrically connected to the conductive path. A tip end of the lead terminal 60 is projected to the non-mounting surface 64 side of the circuit board 11.

Figure 6:
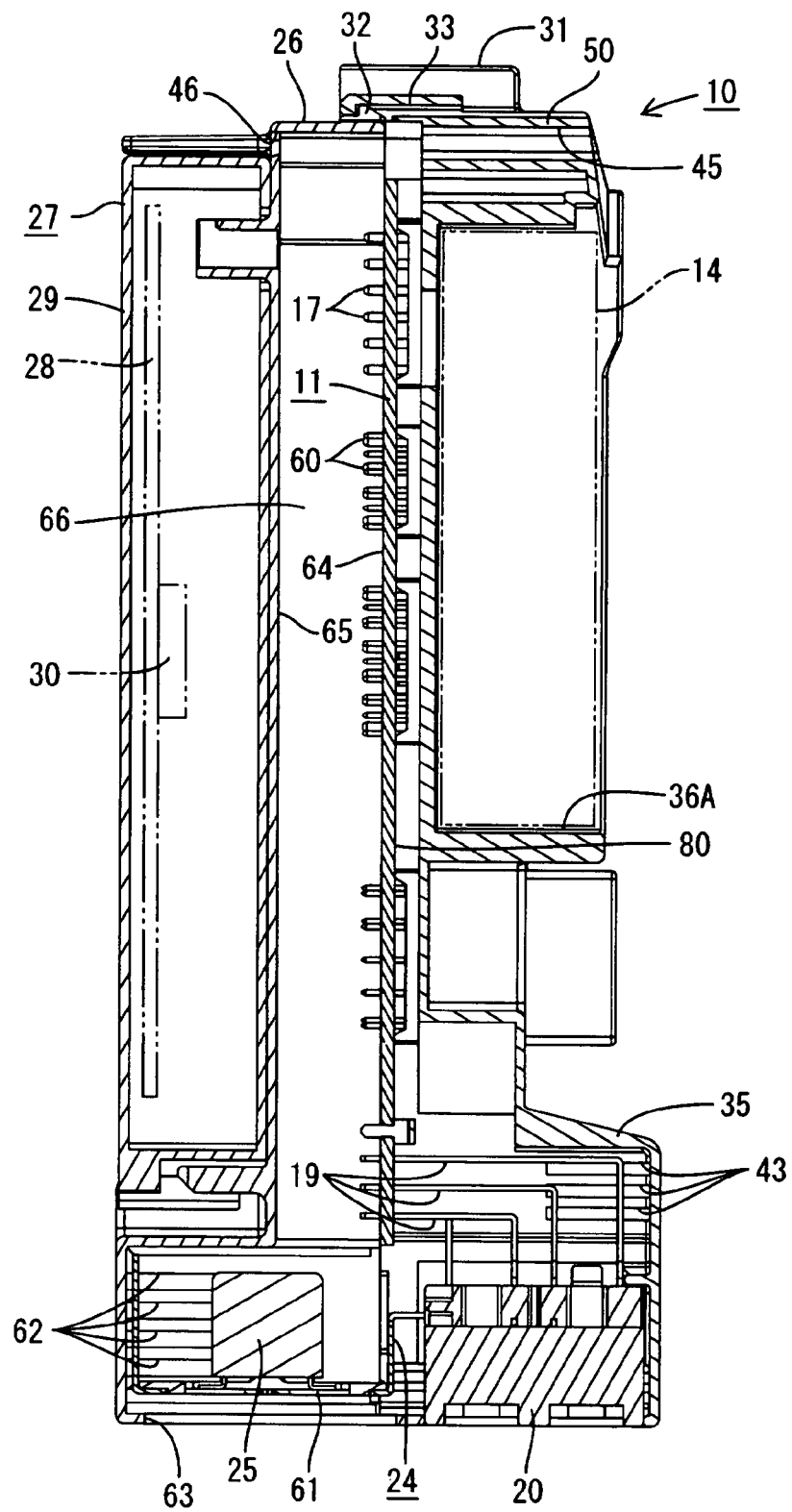
FIG. 6 is a sectional view taken along the line A-A in FIG. 3.

As shown in FIGS. 6 and 7, at a lower end portion of the circuit board 11, one end portions of a plurality of terminal fittings 19 penetrate through the circuit board 11, and the end portions are soldered to through-holes formed in the circuit board 11 and electrically connected to the conductive path. The other end portions of the terminal fittings 19 are bent downward into a substantially L-shape and fitted to a fuse block 20 which will be described later. The other end portions of the terminal fittings 19 are made fuse terminals 21 to which fuses 15 are fitted.

Figure 4:
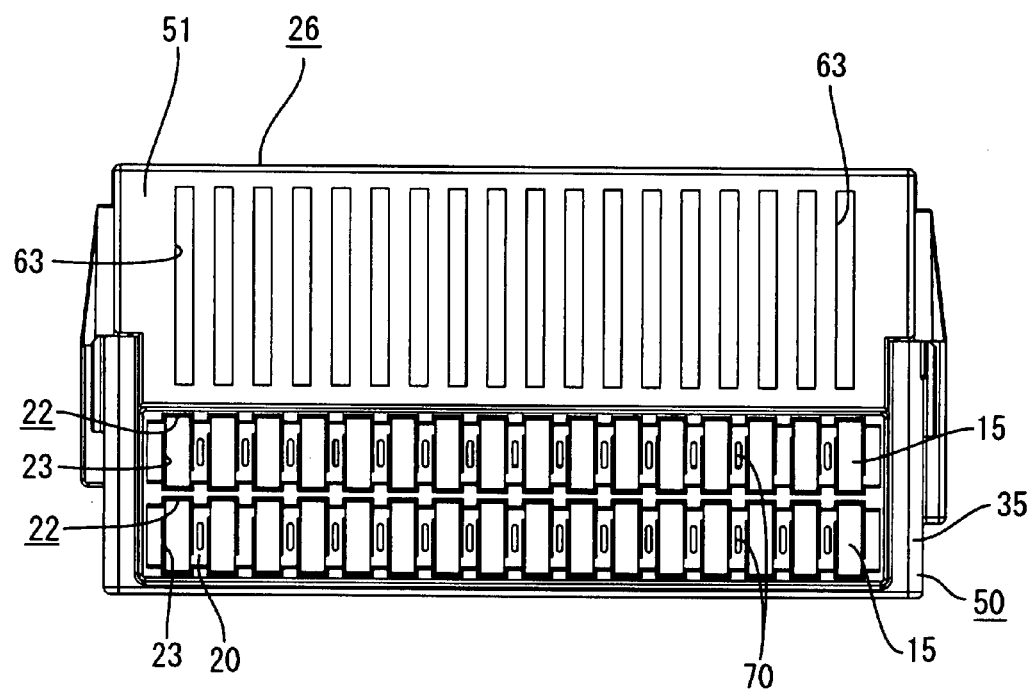
FIG. 4 is a bottom view of the electric connection box.

As shown in FIG. 6, the fuse block 20 is made of a synthetic resin and is in a substantially rectangular shape. Fuse installing portions 22 for installing fuses 15 are formed on an undersurface of the fuse block 20 to be depressed upward in FIG. 7, and opening portions 23 opened downward are formed. The fuse terminals 21 of the above described terminal fittings 19 face insides of the fuse installing portions 22. As shown in FIG. 4, the fuse installing portions 22 are formed to be aligned in a lateral direction in FIG. 4 and also aligned vertically in FIG. 4 (in this illustrative aspect, they are aligned vertically in two tiers). Through-holes 44 are formed in upper walls of the fuse installing portions 22, and thereby, external air can flow into a fuse housing part 35 which will be described later through the through-holes 44 from the fuse installing portions 22. As a result, the fuses 15 can be air-cooled. In the fuse block 20, air holes 70 are provided between the adjacent fuse installing portions 22 to penetrate through a bottom wall of the fuse block 20 so as to cause an internal space of the fuse housing part 35 to communicate with an external space. External air can flow into the case 10 from the air holes 70. Thereby, heat dissipation performance of the electric connection box can be enhanced.

A bus bar 24 formed to be bent into a substantially S-shape seen from a side is fitted to the fuse installing portion 22 located at the left side in FIG. 7, and a right end of the bus bar 24 faces the inside of the fuse installing portion 22. The bus bar 24 is electrically connected to the circuit board 11 through the fuse 15 and the terminal fitting 19 as shown in FIG. 7. At the bus bar 24, an intersection portion 61 extending in a direction to intersect the plate face of the circuit board 11 is formed, and a plurality of relays (an example of the heat generating component) 25 are connected to a top surface of the intersection portion 61 in FIG. 7. The relays 25 include an ignition relay 25 which is energized when an ignition key is in an ignition position, and an accessory relay 25 which is energized when the ignition key is in an accessory position. FIG. 7 shows the configuration in which the bus bar 24 is electrically connected to the circuit board 11 through the fuse 15, but a configuration in which the bus bar 24 is directly connected to the circuit board 11 by soldering or the like may be adopted.

An insulating film (not shown) is formed on the above described terminal fittings 19 and bus bars 24 except for connecting portions with the fuses 15 and the relays 25. Thereby, even if dust attaches to the adjacent terminal fittings 19 or the adjacent bus bars 24 to be across them, the terminal fittings 19 or the bus bars 24 can be prevented from being short-circuited.

Though not shown in detail, a joint terminal (not shown) for connecting to an ECU 27 which will be described later is mounted to the non-mounting surface 64 at an upper end edge of the circuit board 11.

(Case)

Figure 1:
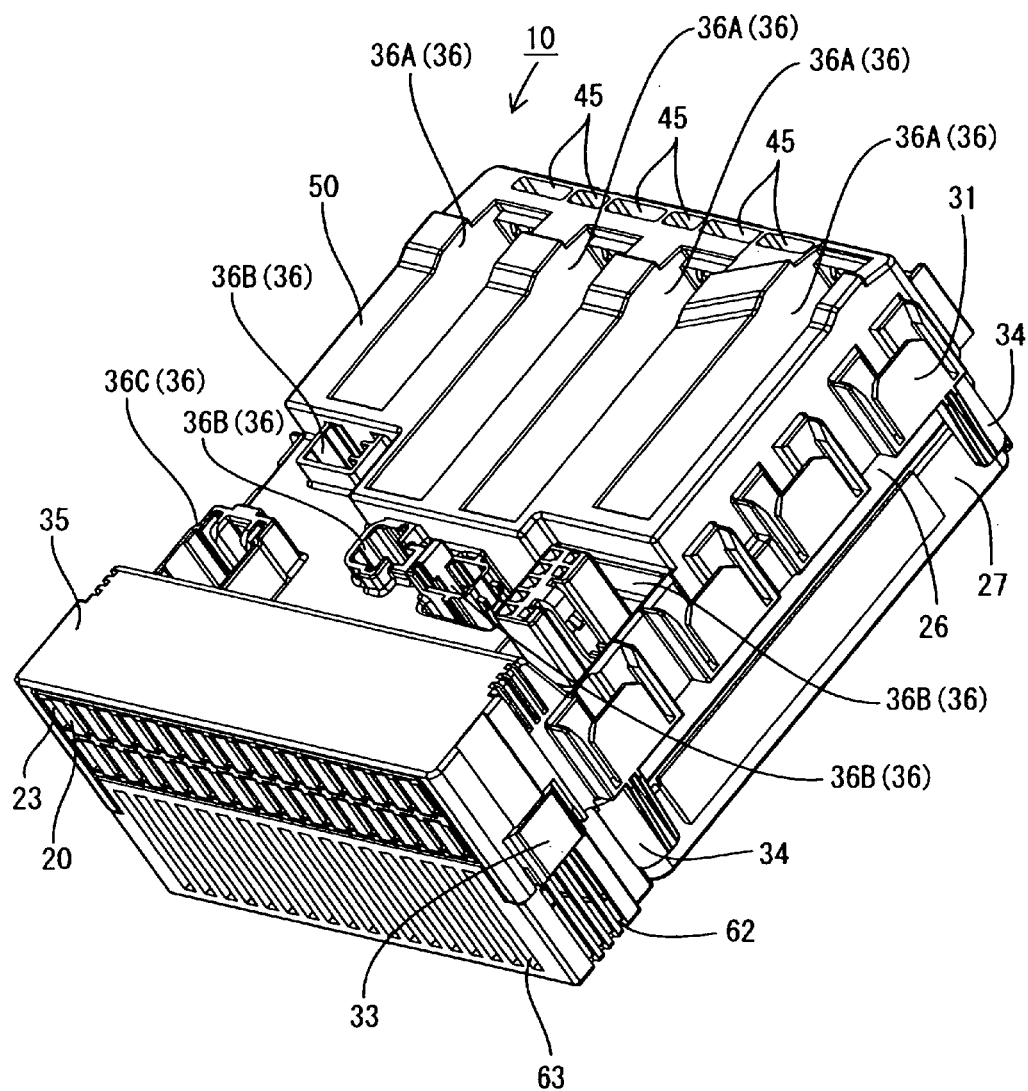
FIG. 1 is a perspective view of an electric connection box according to an illustrative aspect of the present invention.
Figure 2:
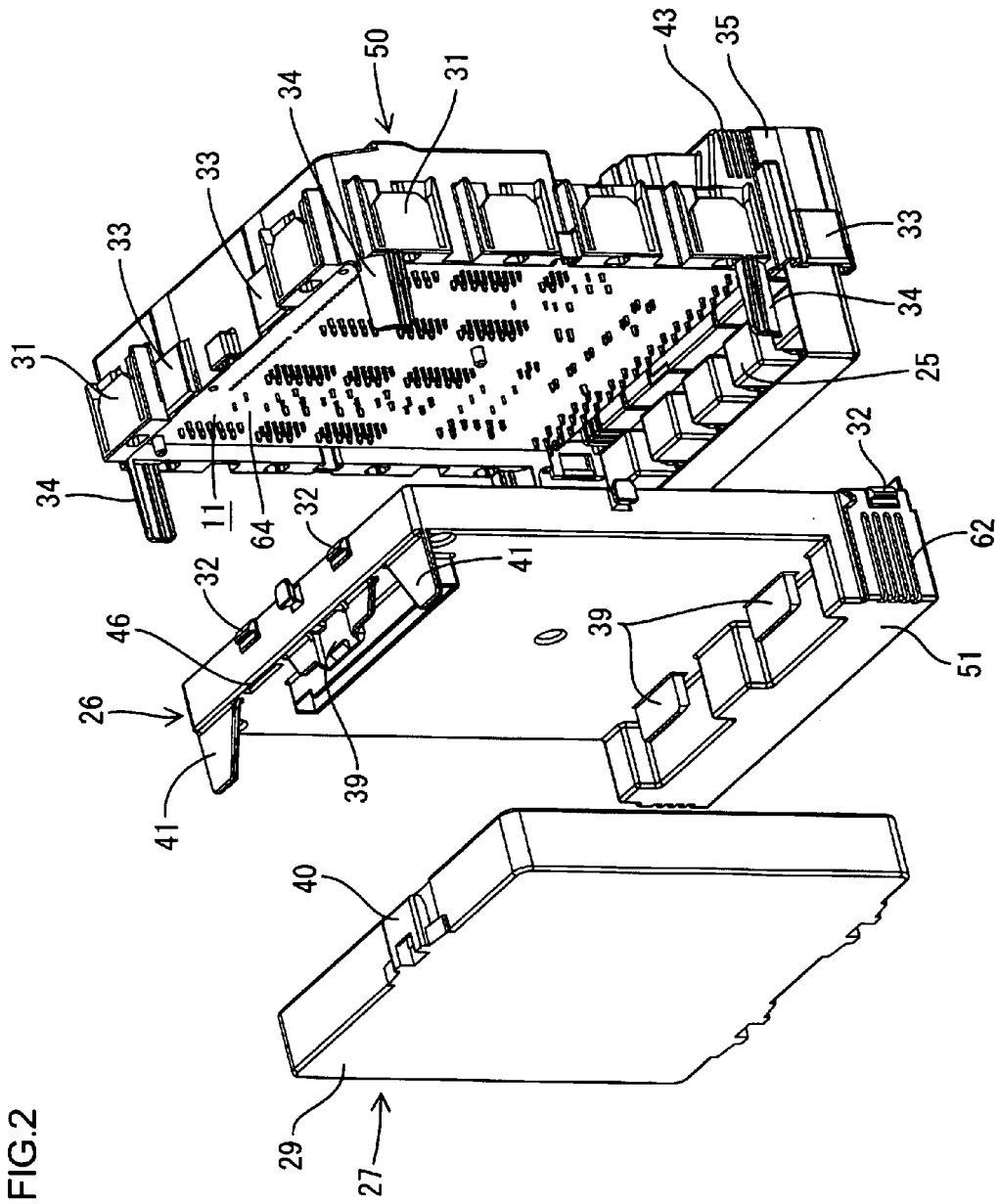
FIG. 2 is an exploded perspective view of the electric connection box.

As shown in FIG. 2, the case 10 is made of a synthetic resin, and includes a flat case main body 50 housing the circuit board 11, and a cover 26 covering an open surface of the case main body 50. The cover 26 is mounted with the ECU 27 on a surface at a side opposite from the case main body 50.

The ECU 27 is formed by an ECU circuit board 28 (shown by the two-dot chain line in FIG. 6) housed in an ECU case 29. A microcomputer 30 (shown by the two-dot chain line in FIG. 6) is mounted on the ECU circuit board 28, and a drive circuit or the like of the intermittent relays 12 is formed. The ECU circuit board 28 and the circuit board 11 are connected by a joint terminal provided to penetrate through the cover 26 and the ECU case 29.

The case main body 50 is formed into a shallow container shape so as to house the circuit board 11 inside. Vehicle body locks 31 for mounting the electric connection box to the vehicle body of an automobile are provided on an outer side surface of a side wall of the case main body 50. Lock receivers 33 which elastically engage with lock projection portions 32 provided on a top surface and a side surface of the cover 26 are provided on a top surface and a side surface of the case main body 50 in FIG. 2, and the case main body 50 and the cover 26 are integrated by the lock receivers 33 and the lock projection portions 32 being engaged with one another.

A lower end portion of the case main body 50 is bulged rightward in FIG. 6, and is made the fuse housing part 35 for housing the above described fuse block 20. A lower end portion of the fuse housing part 35 is opened downward, and the fuse block 20 is fitted in the opening portion 23. As shown in FIG. 6, a lower opened edge portion of the fuse housing part 35 and an outer side surface of a bottom portion of the fuse block 20 are set to be substantially flush with each other.

A connector fitting portion (an example of a fitting portion) 36 which is recessed to the circuit board 11 side (left side in FIG. 6) for fitting the connector 14 therein is provided at a right side wall (side wall opposed to the mounting surface 80 of the circuit board 11) of the case main body 50 in FIG. 6.

Figure 3:
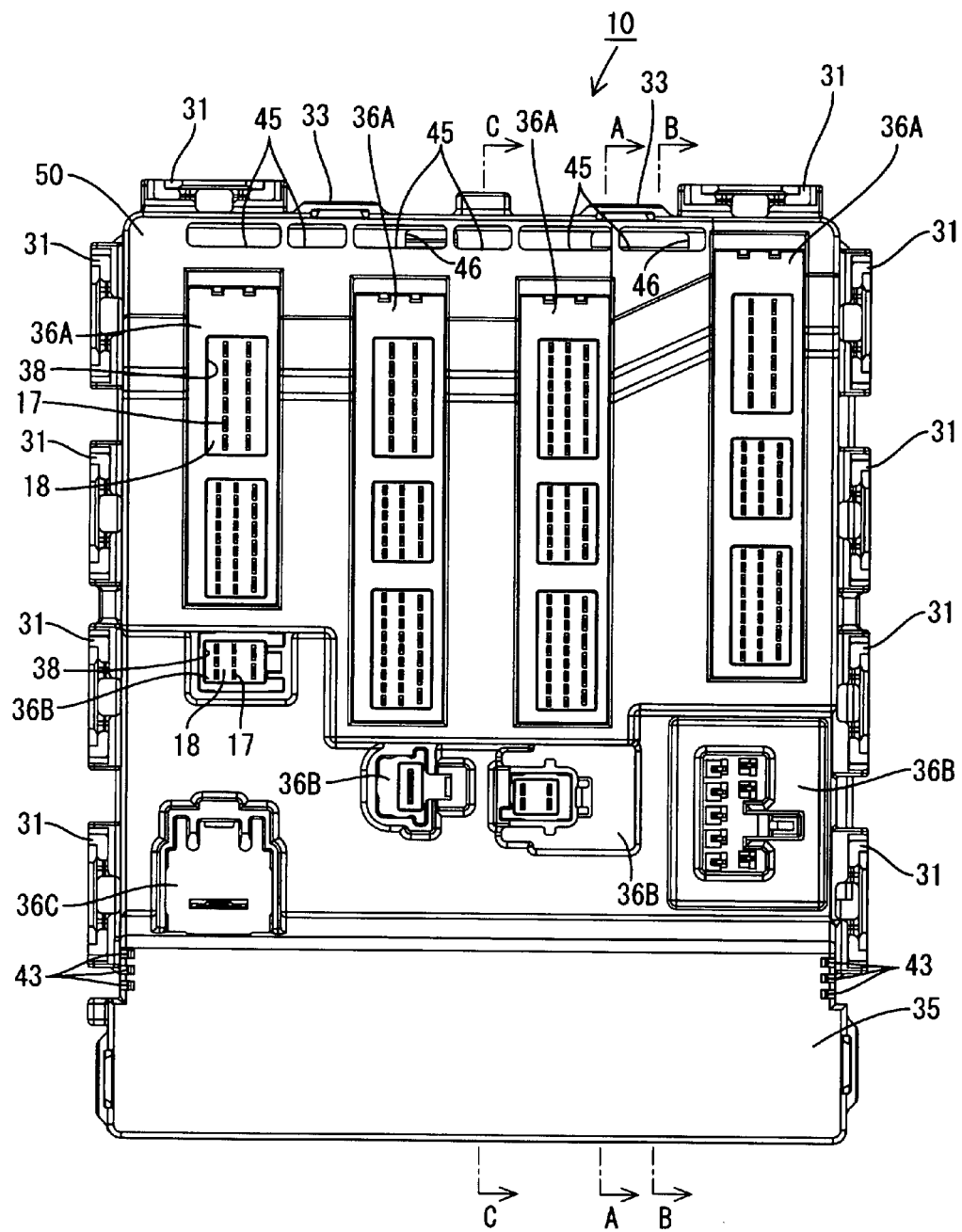
FIG. 3 is a front view of the electric connection box.

As shown in FIG. 3, an upper connector fitting portion 36A formed at an upper side of the case main body 50 is formed to extend in the vertical direction, and a plurality of (four in this illustrative aspect) upper connector fitting portions 36A are formed to be aligned with spacing between them in the lateral direction in FIG. 3. At a position under each of the upper connector fitting portions 36A, a plurality of (four in this illustrative aspect) lower connector fitting portions 36B are formed to be aligned with spacing between them in the lateral direction in FIG. 3. Below the lower connector fitting portion 36B located at the left end in FIG. 3, a power source connector fitting portion 36C which is connected to a power source line (not shown) of a battery is formed. As shown in FIG. 3, windows 38 are opened in back walls of the upper, lower and power source connector fitting portions 36A, 36B and 36C. From the windows 38, the above described male tabs 17 and male tab pedestals 18 face the upper, lower and power source connector fitting portions 36A, 36B and 36C (see FIG. 3).

Figure 5:
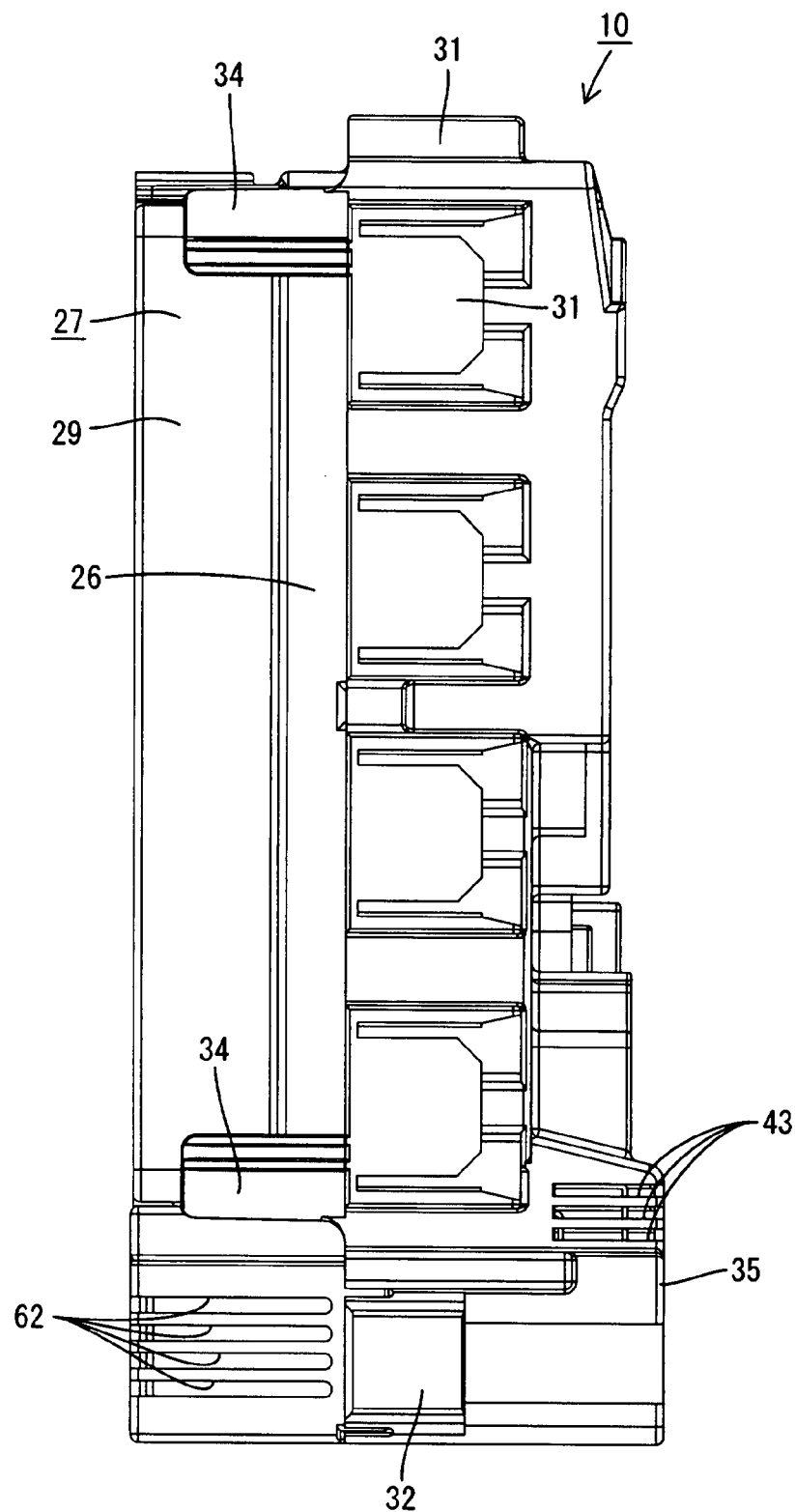
FIG. 5 is a side view of the electric connection box.

As shown in FIG. 5, at the upper portion of the fuse housing part 35 of the case main body 50, vent holes 43 are formed to extend in the lateral direction in FIG. 5. External air can flow into the inside of the case 10 from the vent holes 43.

The cover 26 is formed into a shallow dish shape as shown in FIG. 2, and is mounted to close the opened surface of the case main body 50. As shown in FIG. 2, the lock projection portions 32 which engage with the lock receivers 33 of the case main body 50 are formed on the upper wall and the side wall of the case main body 50. In the cover 26, an elastically bendable lock 39 projected to the ECU 27 side is formed on a wall surface opposed to the ECU 27. The lock 39 is elastically engaged with a lock receiver 40 formed at the ECU 27 so that the cover 26 and the ECU 27 are integrated.

As shown in FIG. 2, a plate-shaped guide portion 41 projected to the ECU 27 side is formed on the wall surface of the cover 26 opposed to the ECU 27. When assembling the cover 26 and the ECU 27, the guide portion 41 slides in contact with an outer surface of the ECU case 29 of the ECU 27, and thereby, the guide portion 41 guides the ECU 27 to a regular assembly position. Further, four guide portions 34 extending toward the cover 26 are provided at four corners of the opened surface of the case main body 50. When assembling the case main body 50, the cover 26 and the ECU 27, the outer side surfaces at positions corresponding to the guide portions 34 in the cover 26 and the ECU 27 slide in contact with the inner side surfaces of the guide portions 34. Thereby, the cover 26 and the ECU 27 are guided to the regular assembly position. A configuration in which the ECU 27 is assembled after the case main body 50 and the cover 26 are assembled may be adopted.

As shown in FIG. 6, a lower end portion of the cover 26 is bulged leftward in FIG. 6, and is made a relay housing part 51 for housing the above described relays 25. As shown in FIG. 6, an outer surface of a bottom wall of the relay housing part 51 is formed to be flush with the outer surface of the bottom portion of the fuse block 20 of the case main body 50. The relay 25 is placed on an inner surface side of a bottom portion of the cover 26.

In a side wall of the relay housing part 51, side portion suction ports 62 are opened to extend in the lateral direction in FIG. 5 and to be aligned vertically. As shown in FIG. 4, in the bottom wall of the relay housing part 51, bottom portion suction ports 63 are opened to extend in the vertical direction in FIG. 4 and to be aligned laterally. By the side portion suction ports 62 and bottom portion suction ports 63, external air is allowed to flow into the case 10.

Meanwhile, as shown in FIG. 7, main body side exhaust ports 45 opened rightward are formed at a position near an upper end portion of the right side wall in FIG. 7. Air is allowed to flow outside the case 10 from the inside of the case 10 by the main body side exhaust ports 45. The main body side exhaust ports 45 are formed at a position near an upper end of the side wall of the case main body 50 to extend in the lateral direction in FIG. 3 and to be aligned laterally with spacing between them as shown in FIG. 3. As shown in FIG. 7, cover side exhaust ports 46 opened leftward to penetrate through the cover 26 are formed at a position near an upper end portion of the side wall of the cover 26 opposed to the circuit board 11. By the cover side exhaust ports 46, the air inside the case 10 is allowed to flow outside the case 10.

The non-mounting surface 64 of the circuit board 11 is placed to be opposed to an inner wall surface 65 of a left side wall of the cover 26 in FIG. 6. Thereby, a ventilation path 66 in which air can be flow vertically is formed between the non-mounting surface 64 of the circuit board 11 and the inner wall surface 65 of the cover 26.

A lower end of the ventilation path 66 communicates with a space inside the relay housing part 51, and the space inside the relay housing part 51 also configures the ventilation path 66. Specifically, the side portion suction ports 62 and the bottom portion suction ports 63 formed in the relay housing part 51 communicate with the ventilation path 66.

An upper end of the ventilation path 66 communicates with the above described cover side exhaust ports 46. As shown in FIGS. 6 and 7, spaces inside the case 10 communicate with each other above the upper end edge of the circuit board 11, and the upper end of the ventilation path 66 also communicates with the above described main body side exhaust ports 45.

Opening areas of the main body side and cover side exhaust ports 45 and 46 are set to be larger than opening areas of the side portion suction ports 62 and the bottom portion suction ports 63.

Subsequently, an operation and effect of the illustrative aspect will be described. When the ignition key is set at the ignition position, the ignition relay 25 is energized. When the ignition switch is set at the accessory position, the accessory relay 25 is energized. Then, the ignition relay 25 and the accessory relay 25 generate heat. Further, by turning on the switches of the other on-vehicle electrical components, the relays 25 performing energization and deenergization control of the other on-vehicle electrical components are energized and generate heat. Thereupon, the temperature of these relays 25 rises. Next, external air flows into the relay housing part 51 (ventilation path 66) from the side portion and bottom portion suction ports 62 and 63 of the relay housing part 51, and contacts the relays 25 fitted inside the relay housing part 51. Then, heat is transferred to air from the relays 25 and the temperature of the air rises. The density of the air becomes small, the air rises in the relay housing part 51 by a chimney effect, enters the ventilation path 66 formed between the non-mounting surface 64 of the circuit board 11 and the inner wall surface 65 of the cover 26, and rises by the chimney effect.

Further, the heat generated from the relays 25 is transferred to the bus bars 24 connected to the relays 25. External air flowing into the space (ventilation path 66) in the relay housing part 51 from the side portion suction ports 62 contacts the bus bar 24, and the heat is transferred to the external air from the bus bar 24. Thereby, the temperature of the air rises, and the air of which density becomes low enters the ventilation path 66 formed between the non-mounting surface 64 of the circuit board 11 and the inner wall surface 65 of the cover 26, and rises by the chimney effect.

The non-mounting surface 64 of the circuit board 11 is not mounted with the electronic components such as the intermittent relays 12 and the resistor 13. The inner wall surface 65 of the cover 26 is made the flat surface as described above. Thus, there is nothing that becomes the flow resistance against the air entering the ventilation path 66, the flow rate of the air flowing in the ventilation path 66 can be made large in this illustrative aspect. Thereby, the cooling efficiency of the relays 25 can be enhanced.

The microcomputer 30 sensitive to heat is mounted in the ECU 27. Therefore, it is necessary to prevent the heat generated from the circuit board 11 and the relays 25 from being transferred to the microcomputer 30. Thus, it is conceivable to place the ECU 27 separately from the circuit board 11 as much as possible, but it is not preferable because the electric connection box is increased in size as a whole. In view of the above described point, in this illustrative aspect, the configuration in which air is caused to flow in the ventilation path 66 by the chimney effect, and therefore, transfer of the heat to the ECU 27 from the circuit board 11 and the relays 25 can be suppressed. Thereby, it is not necessary to place the ECU 27 to be away from the cover 26, and the electric connection box can be downsized as a whole.

The tip ends of the lead terminals 60 of the intermittent relays 12 and the resistor 13 are projected on the non-mounting surface 64 of the circuit board 11. When the intermittent relays 12 and the resistor 13 are energized, the heat generated from the intermittent relays 12 and the resistor 13 is transferred to the lead terminals 60. The heat transferred to the lead terminals 60 contacts the air flowing in the ventilation path 66 and is cooled by the air. Thereby, the cooling efficiency of the intermittent relays 12 and the resistor 13 can be enhanced.

The air rises up to the upper end of the ventilation path 66 flows to the outside of the case 10 from the main body side exhaust ports 45 and the cover side exhaust ports 46. Thereby, the heat generated from the relays 25 is efficiently dissipated to the outside.

Since it is the tip ends of the lead terminals 60 that are exposed to the ventilation path 66, they do not become a large resistance when the air flows, and do not have such an influence as to reduce the flow rate of the air flowing in the ventilation path 66.

As above, according to the illustrative aspect, the air flowing into the case 10 from the side portion and bottom portion suction ports 62 and 63 contacts the relays 25 placed inside the ventilation path 66, and thereby, the heat generated from the relays 25 is transferred to the air. The air of which temperature rises due to the heat has low density, and rises in the ventilation path 66 by a so-called chimney effect, and flows outside the case 10 from the main body side and the cover side exhaust ports 45 and 46. Thereby, the heat generated from the relays 25 is dissipated to the outside of the case 10, and is not confined within the case 10.

Air flows between the non-mounting surface 64 of the circuit board 11 and the inner wall surface 65 of the cover 26, and nothing becomes a resistance when the air rises in the ventilation path 66, and therefore, the flow rate of the air in the ventilation path 66 can be increased. Thereby, the cooling efficiency of the relays 25 can be enhanced.

As above, according to the illustrative aspect, the heat dissipation performance is significantly enhanced, and even when the electric connection box is downsized, the temperature of the inside can be prevented from being abnormally high.

The relays 25 include the ignition relay 25 and the accessory relay 25, which are always energized and generate heat when the vehicle is in a traveling state. Therefore, their heating value becomes large, and necessity of cooling the above described ignition relay 25 and the accessory relay 25 is high. According to the illustrative aspect, the ignition relay 25 and the accessory relay 25 can be efficiently cooled.

Further, the configuration in which the relays 25 are placed at the bottom portion in the case is adopted. Thereby, the temperature of the lower portion of the ventilation path 66 can be made higher than that of the upper portion. The flow rate of air by a chimney effect becomes higher as the temperature difference between the top and bottom of the ventilation path 66 is larger, and therefore, the flow rate of the air inside the ventilation path 66 can be more increased. Thereby, heat dissipation performance can be further enhanced.

In addition, the tip ends of the lead terminals 60 are exposed to the ventilation path 66. Therefore, the heat generated from the intermittent relays 12 and the resistor 13 mounted on the circuit board 11 is transferred to the lead terminals 60, and thereafter, transferred to the air flowing in the ventilation path 66. As a result, the heat generated from the intermittent relays 12 and the resistor 13 can be cooled by the air flowing in the ventilation path 66, and therefore, the heat dissipation performance of the electric connection box can be enhanced.

The air flowing into the case 10 from the bottom portion suction ports 63 provided on the bottom wall of the cover 26 contacts the relays 25 from below. Thereby, the time in which the air and the relays 25 are in contact with each other can be made long as compared with the case where the suction ports are provided on only the side wall of the case 10, for example, and the air flowing from the suction ports contacts the relays 25 from the side. As a result, the cooling efficiency of the relays 25 can be enhanced.

Subsequently, the heat generated from the relays 25 is transferred to the bus bars 24, and thereafter, is transferred to the air flowing in the ventilation path 66. The bus bars 24 become usable as the heat dissipating members like this, and therefore, the cooling efficiency of the relays 25 can be enhanced.

The air which absorbs the heat from the relays 25 and rises in temperature expands in volume. Therefore, the volume of the air in the main body side and cover side exhaust ports 45 and 46 expands from the volume of the air when flowing into the case 10 from the side portion and bottom portion suction ports 62 and 63. Accordingly, for example, when the opening areas of the main body side and cover side exhaust ports 45 and 46 and the side portion and bottom portion suction ports 62 and 63 are set to be equal, it is feared that the air becomes difficult to discharge from the main body side and cover side exhaust ports 45 and 46.

Thus, according to the illustrative aspect, the opening areas of the main body side and cover side exhaust ports 45 and 46 are set to be larger than the opening areas of the side portion and bottom portion suction ports 62 and 63, and therefore, even when the air absorbs the heat from the relays 25 and its volume expands, the air easily flows out from the main body side and cover side exhaust ports 45 and 46.

For example, when the electric connection box is placed below the duct of an air conditioner, it is feared that water droplets condensing on the duct drop onto the electric connection box. In such a case, if the main body side and cover side exhaust ports 45 and 46 are provided on the upper wall of the case 10, it is feared that water droplets enter the electric connection box from the main body side and cover side exhaust ports 45 and 46. According to the illustrative aspect, the main body side and cover side exhaust ports 45 and 46 are formed in the side wall of the case 10 and are opened laterally, and therefore, the water droplets dropping from above can be prevented from entering the inside of the case 10.

It is feared that dust enters the case 10 from the side portion and bottom portion suction ports 62 and 63. If the dust contacts the adjacent bus bars 24 to be across them, the bus bars 24 are likely to be short-circuited. According to the illustrative aspect, the insulating film is formed on the bus bars 24, and therefore even if dust contacts the adjacent bus bars 24 to be across them, the bus bars 24 can be prevented from being short-circuited.

Figure 8:
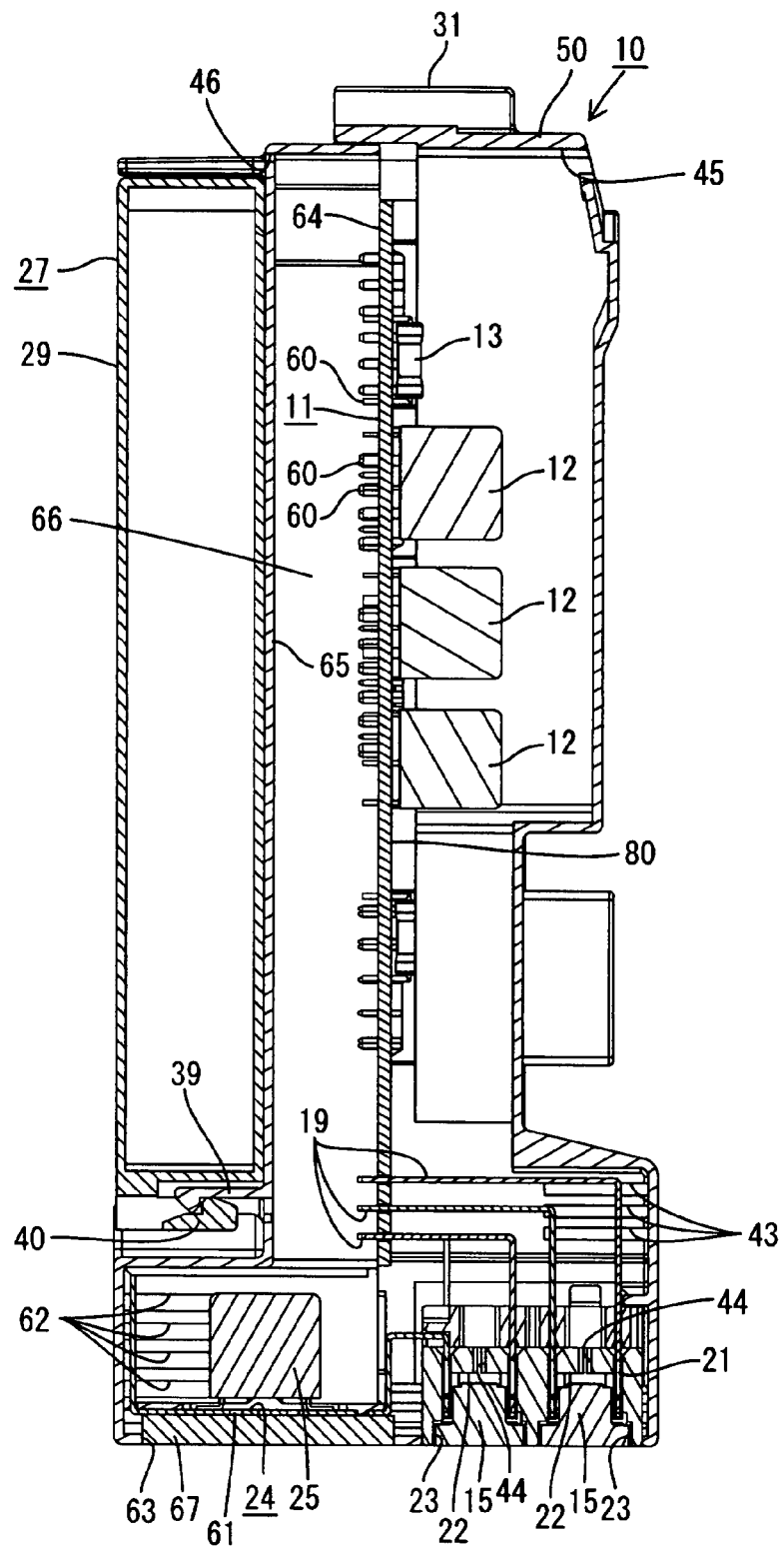
FIG. 8 is a sectional view of an electric connection box according to an illustrative aspect of the present invention.

Next, another illustrative aspect of the present invention will be described with reference to FIG. 8. As shown in FIG. 8, a metal heat dissipating plate (an example of a heat dissipating member) 67 is placed on an undersurface of the bus bar 24 in FIG. 8 via a bonding layer not shown. The heat dissipating plate 67 is exposed to the outside of the case 10 from an opening 68 provided in the bottom wall of the cover 26. This illustrative aspect is substantially the same as the previous illustrative aspect except for the above described configuration. Therefore, the same components are assigned with the same reference numerals, and the redundant explanation will be omitted.

According to the illustrative aspect, the heat generated from the relays 25 is transferred to the heat dissipating plate 67 via the bus bars 24, and is dissipated to the outside of the case 10 from the dissipating plate 67. Thereby, the heat dissipation performance of the electric connection box is further enhanced.

Figure 9:
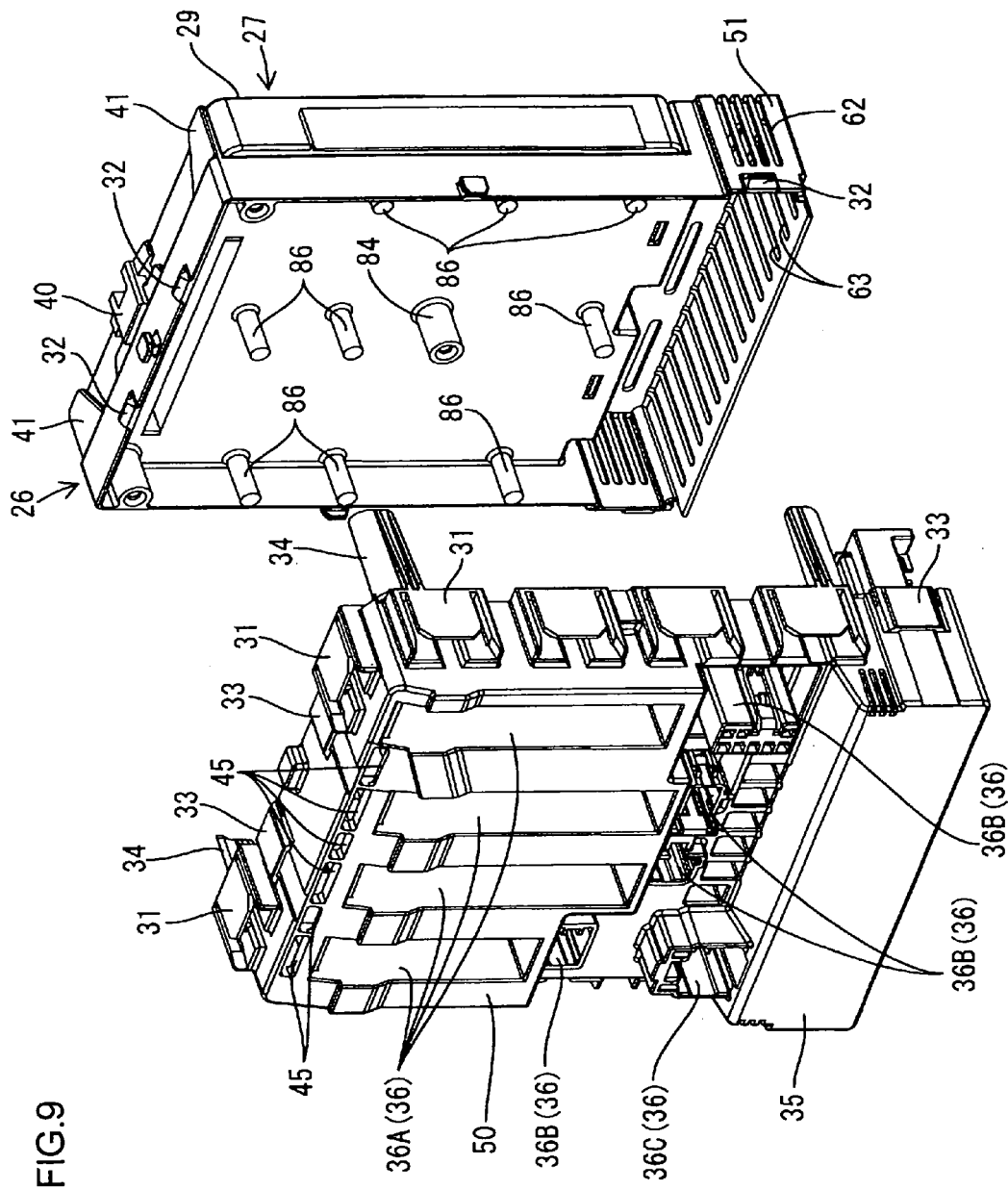
FIG. 9 is an exploded perspective view of an electric connection box according to an illustrative aspect of the present invention.
Figure 10:
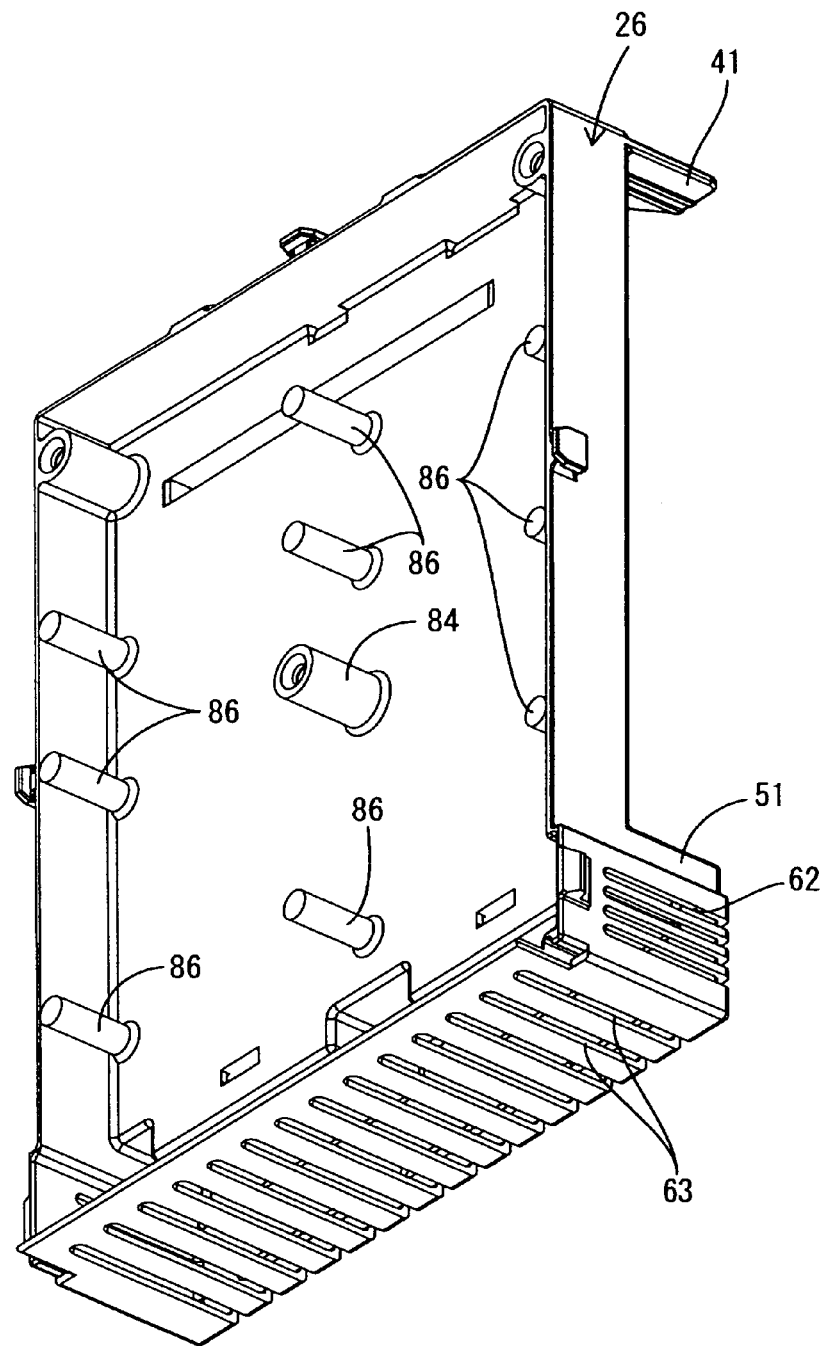
FIG. 10 is a perspective view of a cover.
Figure 11:
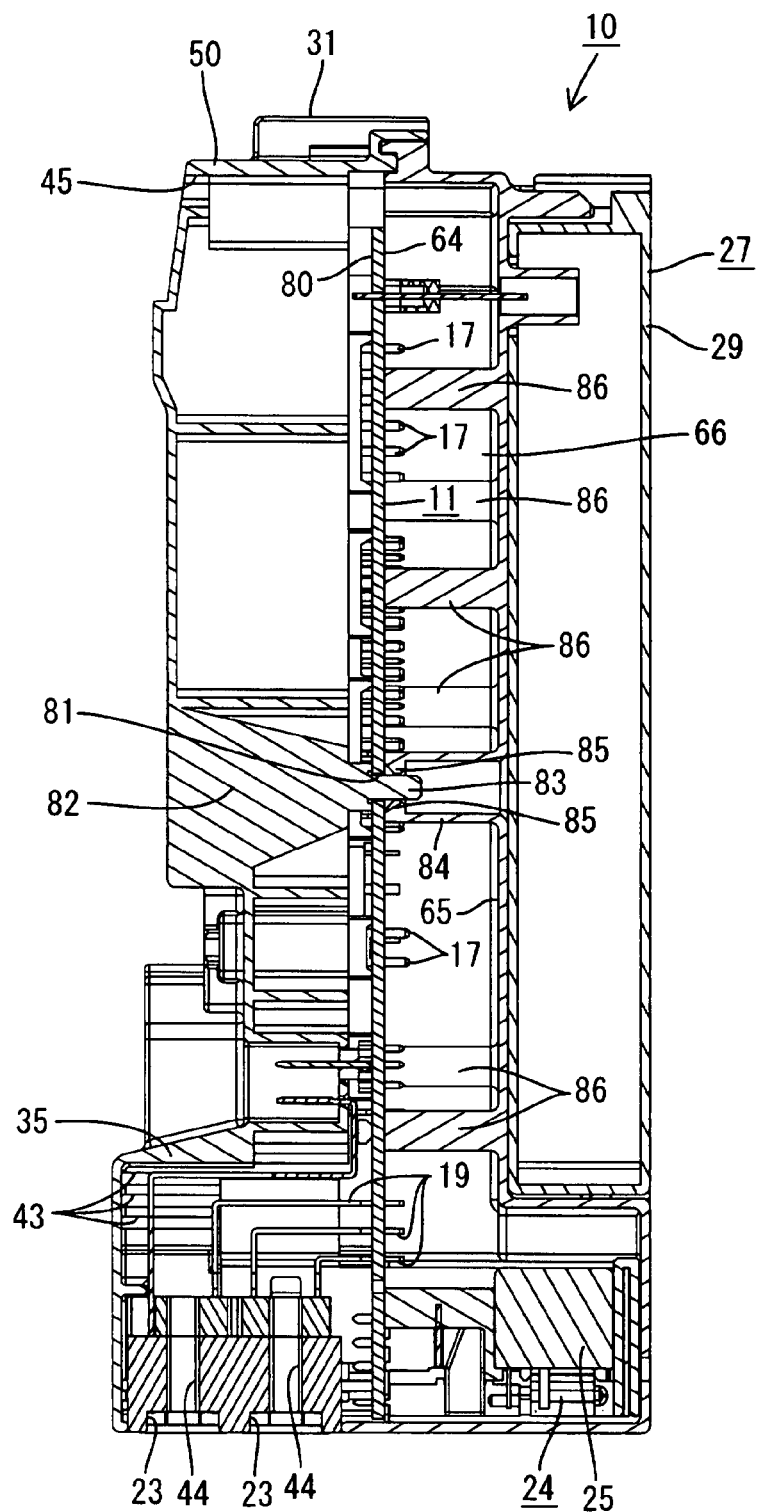
FIG. 11 is a sectional view corresponding to the line C-C in FIG. 3 in the electric connection box according to the illustrative aspect.

Next, another illustrative aspect of the present invention will be described with reference to FIG. 6 and FIGS. 9 to 11. As shown in FIG. 11, an insertion hole 81 which penetrates through the circuit board 11 is provided in a substantially center in the vertical direction of the circuit board 11 in FIG. 11.

A holding projection portion 82 which projects to the circuit board 11 side is provided at a position corresponding to the insertion hole 81, in the inner wall of the case main body 50. An end portion of the holding projection portion 82 at the circuit board 11 side (right side in FIG. 11) abuts on the mounting surface 80 of the circuit board 11 from the left side. A holding pin 83 projected rightward in FIG. 11 is provided at a tip end (right end in FIG. 11) of the holding projection portion 82. The holding pin 83 is inserted through the insertion hole 81 of the circuit board 11.

Of the inner wall of the cover 26, in a position corresponding to the insertion hole 81, a cylindrical portion 84 projected to the circuit board 11 side is formed. The cylindrical portion 84 is formed into a substantially cylindrical shape. An end portion at the circuit board 11 side (left side in FIG. 11), of the cylindrical portion 84 abuts on the non-mounting surface 64 of the circuit board 11 from the right side. The circuit board 11 is held between a right end of the above described holding pin 83 and a left end of the cylindrical portion 84.

A claw portion 85 projected in an inner circumferential direction of the cylindrical portion 84 is provided at the end portion of the cylindrical portion 84 at the circuit board 11 side. The above described holding pin 83 penetrates through the insertion hole 81 of the circuit board 11, and further inserted into the cylindrical portion 84. The claw portion 85 of the cylindrical portion 84 abuts on an outer circumferential surface of the holding pin 83. Thereby, a frictional force of the claw portion 85 and the outer circumferential surface of the holding pin 83 occurs. By the frictional force, displacement of the holding pin 83 in a direction to remove from the cylindrical portion 84 (leftward in FIG. 11) can be suppressed.

As shown in FIG. 11, on an inner wall surface of a side wall opposed to the non-mounting surface 64 of the circuit board 11, of the side wall of the cover 26, bosses 86 which project to the circuit board 11 side (leftward in FIG. 11) are formed integrally with the cover 26. As shown in FIGS. 9 and 10, the cover 26 is provided with a plurality of bosses 86. The boss 86 is formed into a substantially cylindrical shape. A plurality of bosses 86 are formed so that the three bosses 86 are aligned in the vertical direction, and vertically aligned three bosses 86 are aligned in each of three columns in the lateral direction in FIG. 10. The bosses 86 formed in the central column in the lateral direction in FIG. 10 are formed to be also aligned with the above described cylindrical portion 84 in the vertical direction.

The dimension of the boss 86 in the lateral direction in FIG. 11 is set such that when the connector 14 is fitted into the connector fitting portion 36, and a force in the direction (direction toward the right from the left in FIG. 11) toward the non-mounting surface 64 side from the mounting surface 80 side of the circuit board 11 is applied to at least the male tabs 17, a projection end portion (left end portion in FIG. 11) of the boss 86 abuts on the circuit board 11 from the non-mounting surface 64 side (right side in FIG. 11).

The configuration except for the above described configuration is substantially the same as the previous illustrative aspect. Therefore, the same components are assigned with the same reference numerals, and the redundant explanation will be omitted.

As shown in FIG. 6, when the connector 14 is fitted into the connector fitting portion 36, the connector 14 contacts the male tabs 17. Thereupon, a force in the direction (direction toward the left side from the right side in FIG. 6) toward the non-mounting surface 64 side is applied to the male tabs 17 from the mounting surface 80 side of the circuit board 11. Thereupon, the circuit board 11 on which the male tabs 17 are placed sometimes bends to the non-mounting surface 64 side (left side in FIG. 6). Thereby, it is feared that connection of the connector 14 and the male tabs 17 becomes insufficient.

Thus, as shown in FIG. 11, this illustrative aspect adopts the configuration in which the bosses 86 which abut on the circuit board 11 from the non-mounting surface 64 side when a force in the direction (direction toward the right side from the left side in FIG. 11) toward the non-mounting surface 64 side from the mounting surface 80 side of the circuit board 11 is applied to at least the male tabs 17 are provided on the inner wall surface of the cover 26, which is opposed to the non-mounting surface 64 of the circuit board 11, to project to the circuit board 11 side. Thereby, the circuit board 11 can be supported with the bosses 86. As a result, the circuit board 11 can be restrained from bending, and therefore, reliability of connection of the connector 14 and the male tabs 17 can be enhanced. FIG. 6 and FIG. 11 are illustrated with the left and right inverted from each other.

The above described bosses 86 are formed integrally with the cover 26, and therefore, the structure is simple.

Further, a plurality of bosses 86 are formed in this illustrative aspect, and therefore, the circuit board 11 can be reliably supported. Thereby, reliability of connection of the connector 14 and the male tabs 17 can be more enhanced.

Further, the space between the cover 26 and the non-mounting surface 64 of the circuit board 11 is made the ventilation path 66 in which air flows in the vertical direction. The bosses 86 are formed in the ventilation path 66. Therefore, it is feared that the bosses 86 give an influence of hindering the flow of the air in the ventilation path 66. Thus, in this illustrative aspect, the configuration in which a plurality of bosses 86 are aligned in the vertical direction is adopted. Thereby, the influence on the flow of the air in the vertical direction in the ventilation path 66 can be made small.

Figure 12:
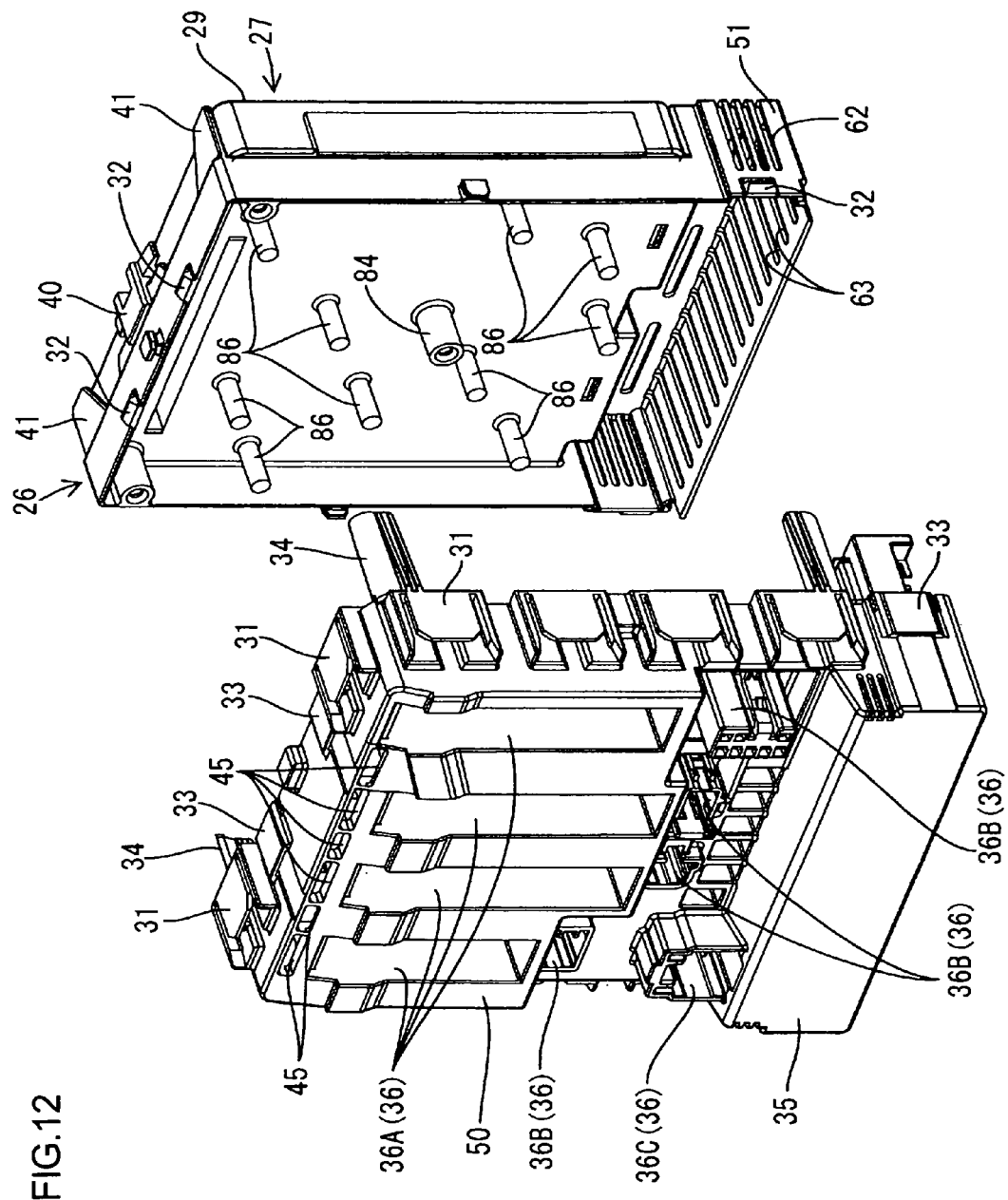
FIG. 12 is an exploded perspective view of an electric connection box according to an illustrative aspect of the present invention.
Figure 13:
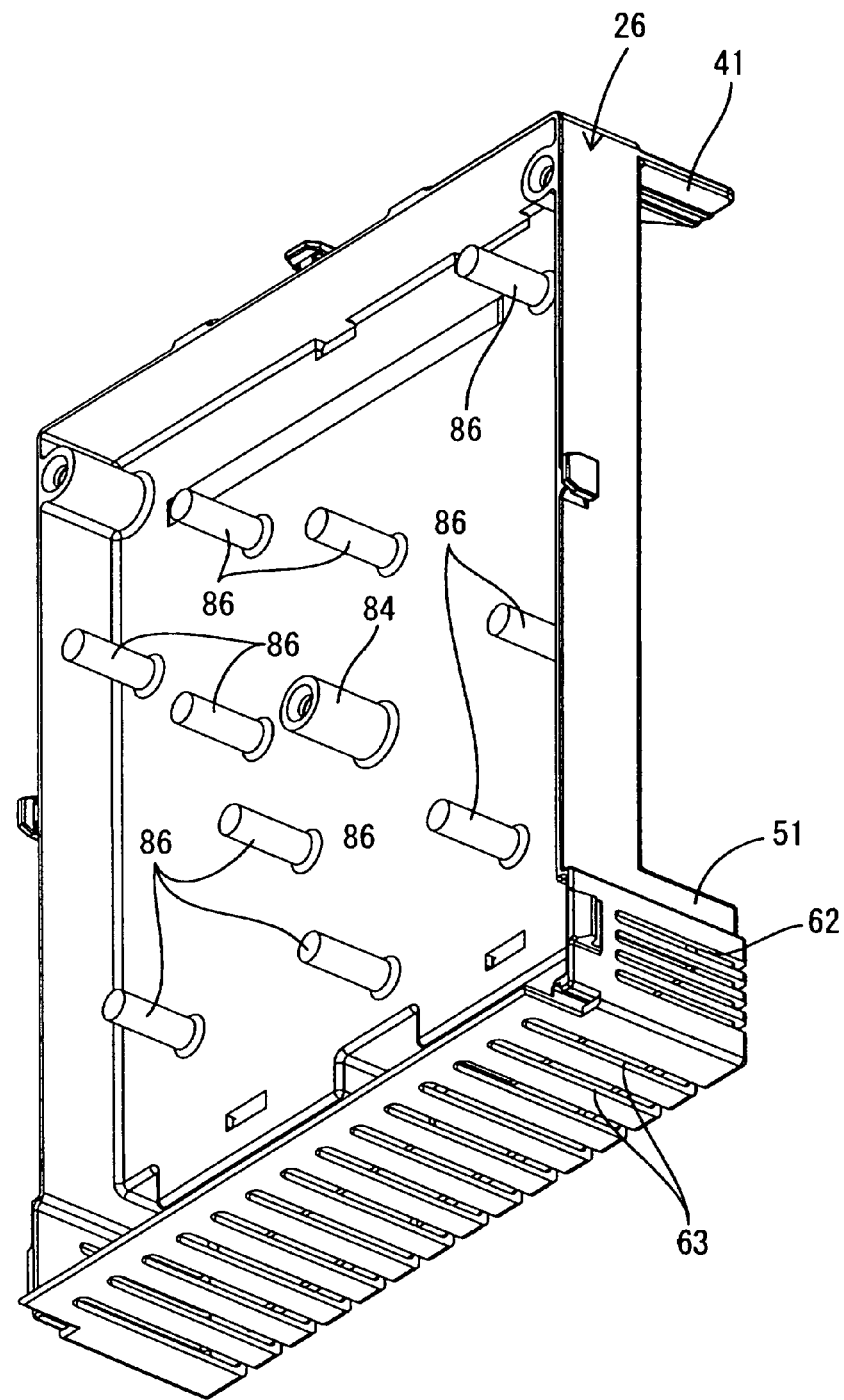
FIG. 13 is a perspective view of a cover.
Figure 14:
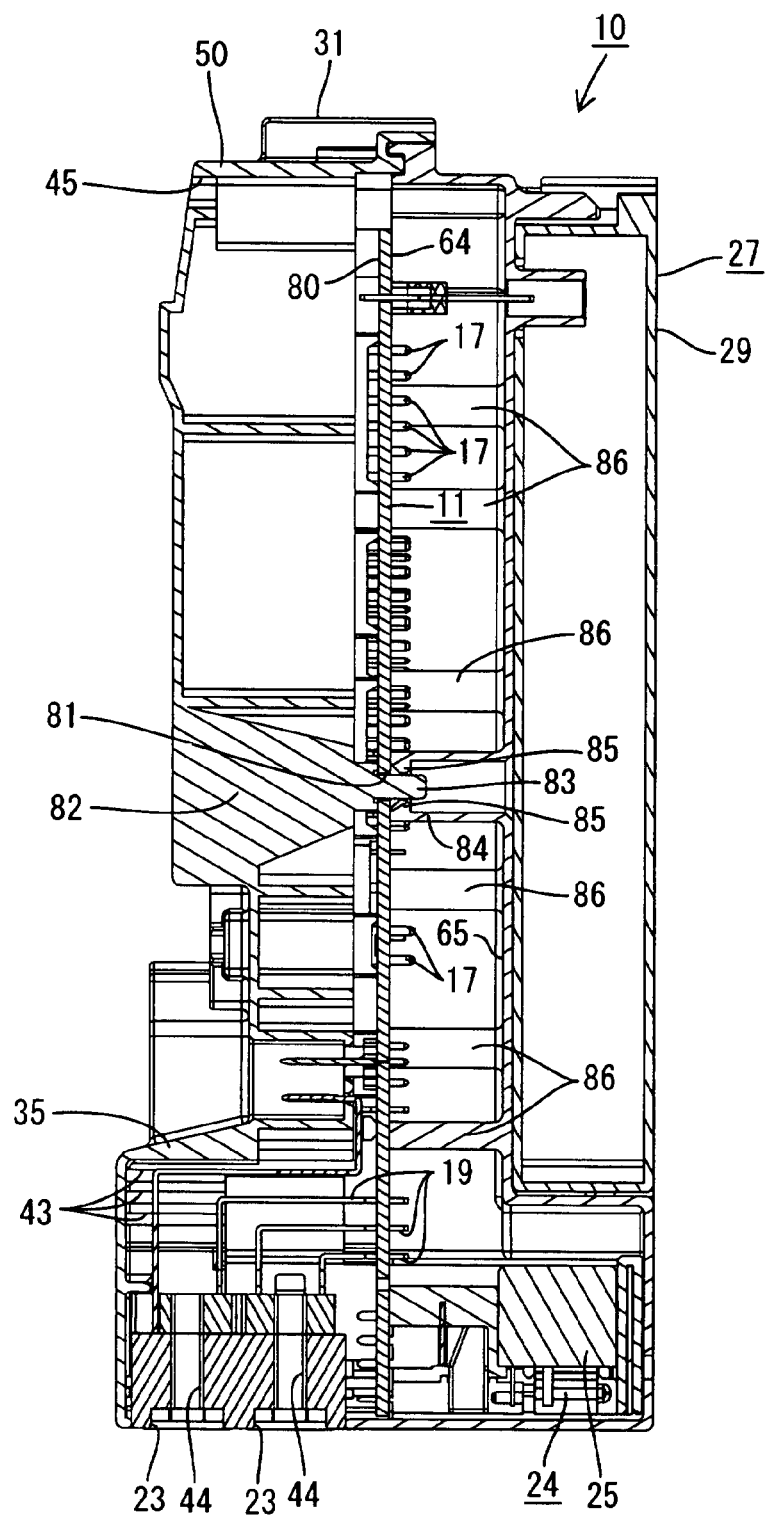
FIG. 14 is a sectional view corresponding to the line C-C in FIG. 3 in the electric connection box according to the illustrative aspect.
Figure 15:
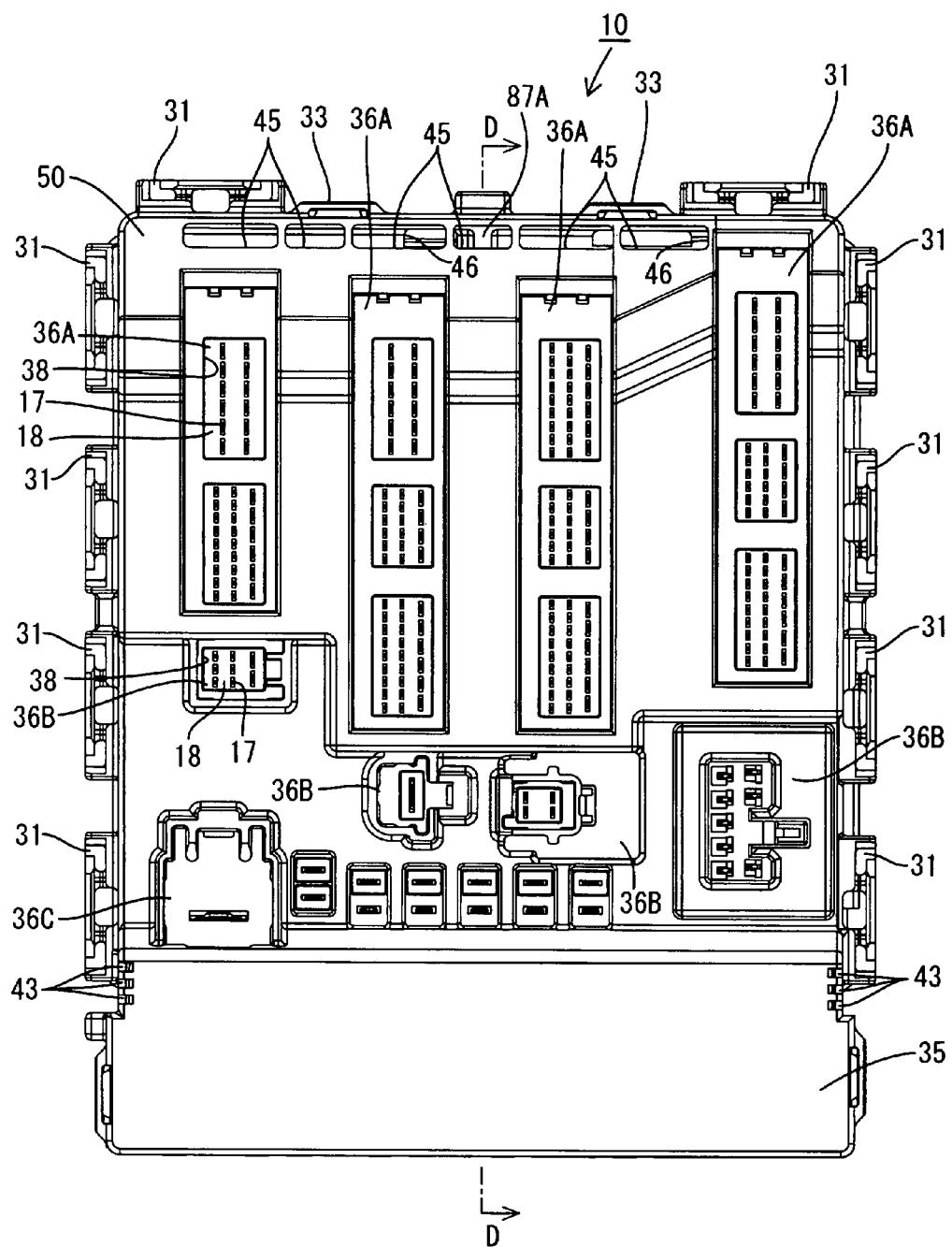
FIG. 15 is a front view of an electric connection box according to an illustrative aspect of the present invention.

Next, another illustrative aspect of the present invention will be described with reference to FIGS. 12 to 14. In this illustrative aspect, a plurality of bosses 86 are provided to project from the surface of the inner wall surface of the cover 26, which is opposed to the non-mounting surface 64 of the circuit board 11. A plurality of bosses 86 are arranged at random on the inner wall surface of the cover 26.

This illustrative aspect is the same as the previous illustrative aspect except for the above described configuration. Therefore, the same components are assigned with the same reference numerals, and the redundant explanation will be omitted.

In this illustrative aspect, a plurality of bosses 86 are arranged at random, and therefore, they can support a force applied to the male tabs 17 in a uniformly distributed state. Thereby, the circuit board 11 can be reliably supported, and therefore, reliability of connection of the connector 14 and the male tabs 17 can be more enhanced.

Figure 16:
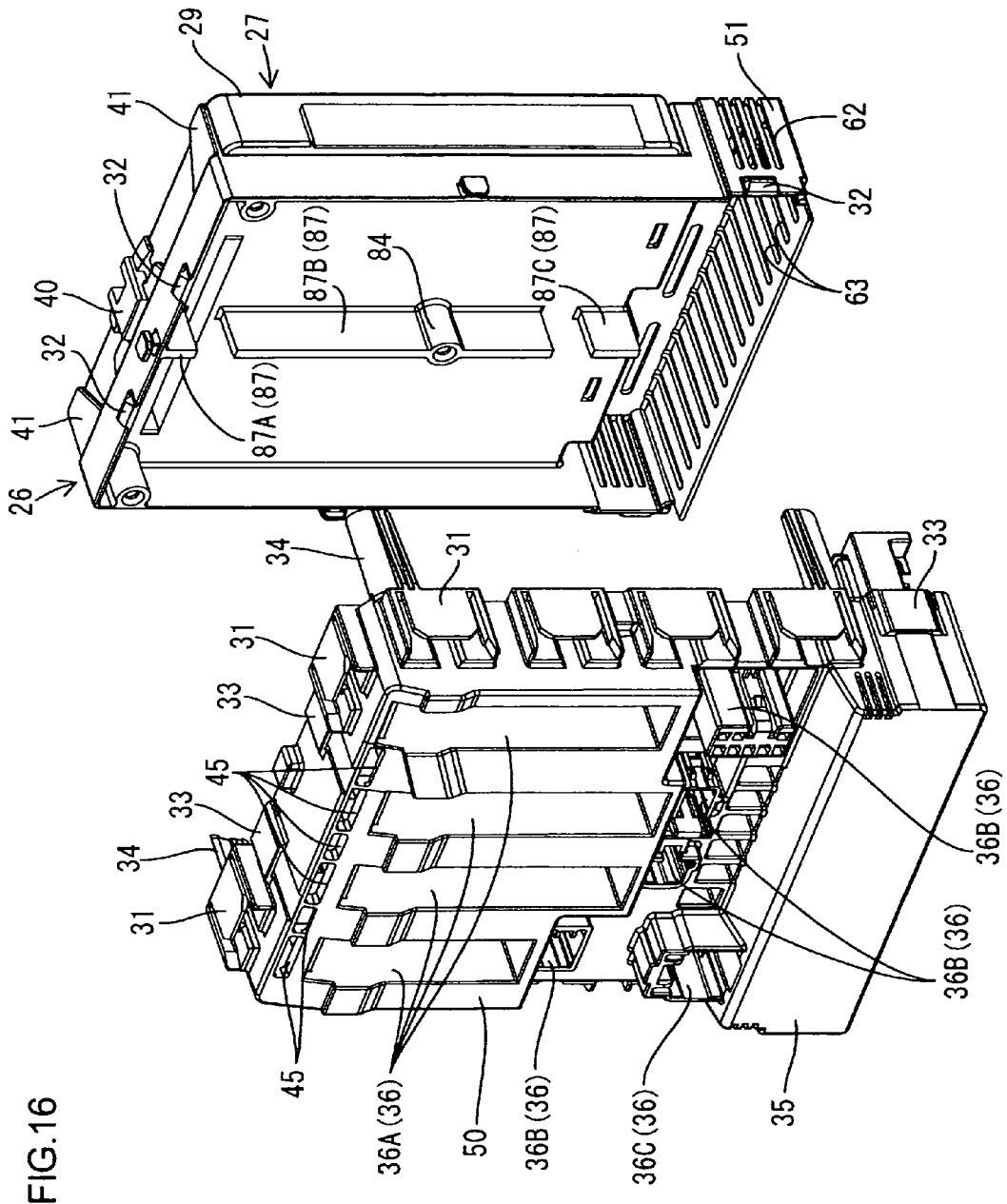
FIG. 16 is an exploded perspective view of the electric connection box.
Figure 17:
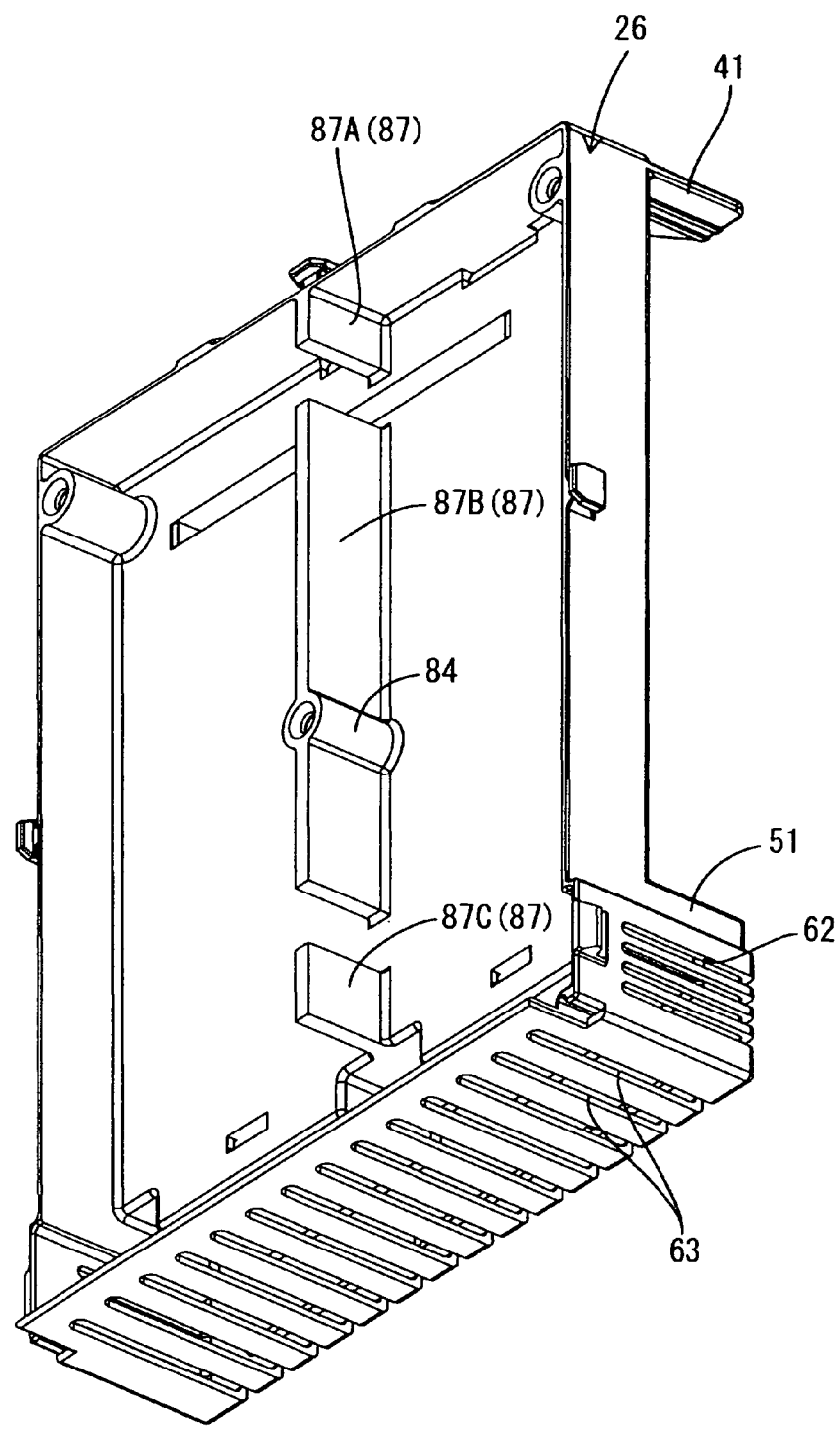
FIG. 17 is a perspective view of a cover.
Figure 18:
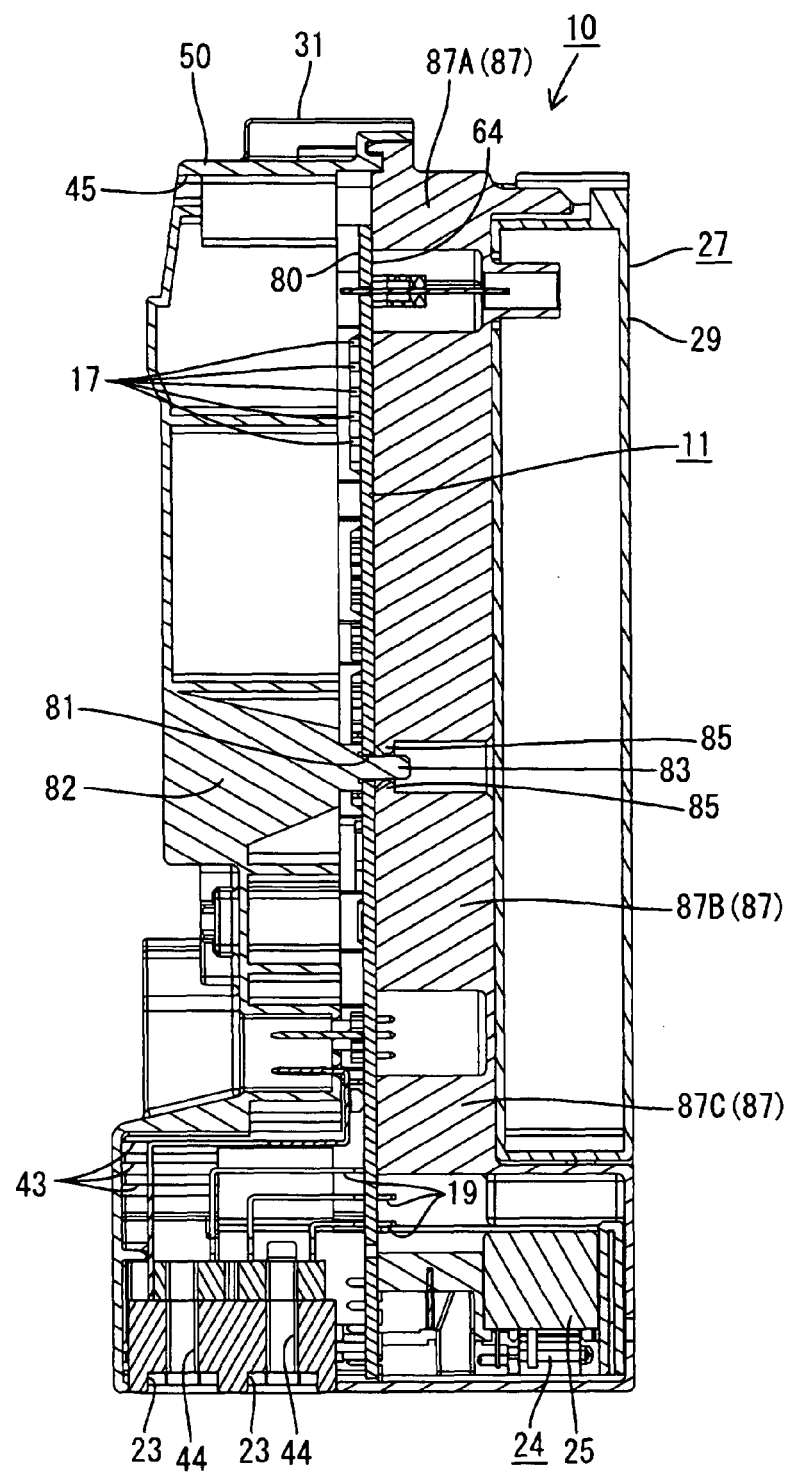
FIG. 18 is a sectional view taken along the line D-D in FIG. 15.

Next, another illustrative aspect of the present invention will be described with reference to FIGS. 15 to 18. As shown in FIG. 18, on the inner wall surface of the side wall of the side wall of the cover 26, which is opposed to the non-mounting surface 64 of the circuit board 11, support walls 87 projected to the circuit board 11 side (leftward in FIG. 18) are formed integrally with the cover 26. As shown in FIGS. 16 and 17, the cover 26 is provided with the three support walls 87 extending in the vertical direction to be spaced from one another. The three support walls 87 are formed to be aligned in the vertical direction. The support walls 87 are configured by an upper support wall 87A located at the uppermost side, a central support wall 87B located below the upper support wall 87A, and a lower support wall 87C located below the central support wall 87B. The cylindrical portion 84 is integrally formed at the central support wall 87B.

The dimension in the lateral direction in FIG. 18 of each of the support walls 87A, 87B and 87C is set such that when the connector 14 is fitted into the connector fitting portion 36, and a force in the direction (direction toward the right from the left in FIG. 18) toward the non-mounting surface 64 side from the mounting surface 80 side of the circuit board 11 is applied to at least the male tabs 17, the projection end portions (left end portions in FIG. 18) of the bosses 86 abut on the circuit board 11 from the non-mounting surface 64 side (right side in FIG. 18).

The illustrative aspect is substantially the same as the previous illustrative aspect except for the above described configuration. Therefore, the same components are assigned with the same reference numerals, and the redundant explanation will be omitted.

According to this illustrative aspect, the circuit board 11 is supported by the end edges of the respective support walls 87A, 87B and 87C, namely, the end edges which linearly extend, and therefore, reliability of connection of the connector 14 and the male tabs 17 can be further enhanced. In addition, the respective support walls 87A, 87B and 87C are formed to extend in the vertical direction, and therefore, they have less fear of hindering flow of the air in the vertical direction in the ventilation path 66.

<Other Illustrative Aspects>

The present invention is not limited to the illustrative aspects described with the above description and drawings, but, for example, the following illustrative aspects are also included in the technical scope of the present invention.

(1) In the above illustrative aspects, the heat generating components are the relays 25, but they may be semiconductor switching elements, or may be fuses, and any electrical components can be used as long as they are electrical components which generate heat by being energized. The heat generating components may not be placed at the bottom portion of the case 10 as long as they are located in the ventilation path 66.

(2) The above illustrative aspects each adopt the configuration in which the main body side and cover side exhaust ports 45 and 46 are provided at the side wall of the case main body 50 and the side wall of the cover 26, but when the electric connection box is installed in the place where water droplets do not drop from above, for example, the exhaust ports may be provided on the top surface of the case 10. For example, a hood may be provided above the exhaust ports to prevent entry of the droplets dropping from above.

(3) The above described illustrative aspects each adopt the configuration in which the side portion suction ports 62 are provided on the side wall of the cover 26, and the bottom portion suction ports 63 are provided on the bottom wall of the cover 26, but the present invention is not limited to the configuration, and may adopt a configuration in which the suction ports are provided on only the bottom wall of the cover 26 or only the side wall.

(4) The above described illustrative aspects each adopt the configuration in which the relays 25 are connected to the bus bars 24, but the configuration in which the relays 25 are mounted on the circuit board 11 may be adopted. For example, a configuration in which the relays 25 are connected to a metal base board separated from the circuit board 11 may be adopted.

(5) In the above described illustrative aspects, the configuration in which the bus bars 24 include the intersection portions 61 intersecting the plate face of the circuit board 11 and the relays 25 are placed on the intersection portions 61 is adopted, but a configuration in which the bus bars 24 are placed to extend downward from the circuit board 11 in the direction along the plate face may be adopted.

(6) The electrical components such as the intermittent relays 12 or the resistor 13 may be mounted on the circuit board 11 by soldering the lead terminals 60 to a land formed on the mounting surface 80 side of the circuit board 11, for example, instead of being mounted with the tip ends of the lead terminals 60 of the electric components projected to the non-mounting surface 64 side of the circuit board 11.

(7) In the above described illustrative aspects, the opening areas of the main body side and cover side exhaust ports 45 and 46 are set to be larger than the opening areas of the side portion and bottom portion suction ports 62 and 63, but the opening areas are not limited to this, and the opening areas of the main body side and cover side exhaust ports 45 and 46 may be set to be the same as or smaller than the side portion and bottom portion suction ports 62 and 63.

(8) By providing cover portions at the rear sides in the exhaust direction of the main body side and cover side exhaust ports 45 and 46, droplets and dust falling from the upper portion of the case 10 may be prevented from entering the case 10 from both the exhaust ports 45 and 46.

(9) The heat dissipating member may not a plate-shaped, but may have a heat dissipating fin.

(10) The relays 25 may not be limited to the ignition relay 25 and the accessory relay 25, but may be switching elements which perform energization and deenergization control of any on-vehicle electrical components.

(11) The electrical component is not limited to the connector 14, but any electrical component such as a fuse or a relay can be used.

(12) One boss 86 may be used as long as it can support the circuit board 11.

What is claimed is:

1. An electric connection box, comprising:
   a circuit board having a first surface capable of mounting an electronic component, and a second surface defining a non-mounting surface;
   a case housing the circuit board, the circuit board oriented in a substantially vertical direction;
   a vertical inner wall surface of the case formed opposite the second surface of said circuit board, the vertical inner wall surface and the second surface of said circuit board defining a substantially vertical air ventilation path;
   a first suction port and a second suction port positioned in said case and in communication with said ventilation path, wherein the first suction port is positioned in a bottom portion of the case and the second suction port is positioned in a lower side portion of the case and the first suction port and the second suction port are configured such that air that passes through the first suction port and air that separately passes through the second suction port converges before or in the ventilation path;
   a first exhaust port and a second exhaust port positioned in said case above said positions of the first suction port and the second suction port in an upper side portion of the case and in communication with said ventilation path, the first exhaust port laterally penetrating the vertical inner wall surface of the case, the second exhaust port laterally penetrating the case opposite the first exhaust port with respect to the ventilation path, and each of the first exhaust port and the second exhaust port having an opening area larger than an opening area of each of the first suction port and the second suction port;
   a bulged section provided on the case, the first suction port is positioned on a bottom surface of the bulged section and the second suction port is positioned on a side surface of the bulged section; and
   a heat generating component positioned in the bulged section and in communication with said ventilation path; wherein
   air flow through the air ventilation path is created by natural convection.

2. The electric connection box according to claim 1, wherein said heat generating component is positioned on the bottom portion of said case.

3. The electric connection box according to claim 2, wherein said electronic component includes a terminal capable of being mounted on said circuit board, said electronic component is mounted on said circuit board with said terminal penetrated to the second surface from the first surface of said circuit board, and a tip end of the terminal of said electronic component is in communication with said ventilation path.

4. The electric connection box according to claim 3, wherein the bottom surface of the bulged section defines a bottom wall of said case.

5. The electric connection box according to claim 1, wherein said heat generating component is connected to a bus bar connected to said circuit board.

6. The electric connection box according to claim 5, wherein an insulating film is formed on the bus bar except for on a connecting portion with said heat generating component.

7. The electric connection box according to claim 6, wherein said case is provided with an opening in an area opposed to said bus bar, and wherein a heat dissipating member is bonded to said bus bar via an insulative bonding layer and the heating dissipating member is positioned in said opening.

8. The electric connection box according to claim 7, wherein on a second side wall of said case opposed to the first surface of said circuit board includes a fitting portion capable of connecting to an electrical component from an outside, and on the first surface of said circuit board, a connection terminal for connecting to said electrical component is placed in a state in which the connection terminal faces an inside of said fitting portion.

9. The electric connection box according to claim 8, wherein on an inner wall surface of said case opposed to the second surface of said circuit board, a support member which abuts on said circuit board from said second surface side when a force toward said second surface side from said first surface side of said circuit board is applied to said connection terminal is provided.

10. The electric connection box according to claim 9, wherein said support member is a boss formed integrally with said case.

11. The electric connection box according to claim 10, wherein a plurality of said bosses are formed, and a plurality of said bosses are formed to be aligned in a vertical direction.

12. The electric connection box according to claim 9. wherein said support member is a support wall formed integrally with said case, and said support wall is formed to extend in the vertical direction.

13. The electric connection box according to claim 1, wherein said electronic component includes a terminal capable of being mounted on said circuit board, said electronic component is mounted on said circuit board with said terminal penetrated to the second surface side from the first surface of said circuit board, and a tip end of the terminal of said electronic component is positioned in said ventilation path.

14. The electric connection box according to claim 1, wherein the bottom surface of the bulged section defines a bottom wall of said case.

15. The electric connection box according to claim 1, wherein on a side wall of said case opposed to the first surface of said circuit board includes a fitting portion capable of connecting to an electrical component from an outside, and on the first surface of said circuit board, a connection terminal for connecting to said electrical component is positioned so that the connection terminal faces an inside of said fitting portion.

16. The electric connection box according to claim 15, wherein on an inner wall surface of said case opposed to the second surface of said circuit board, a support member which abuts on said circuit board from a side of said second surface when a force toward the side of said second surface from a side of said first surface of said circuit board is applied to said connection terminal is provided.

17. The electric connection box according to claim 16, wherein said support member is a boss formed integrally with said case.

18. The electric connection box according to claim 16, wherein said support member is a support wall formed integrally with said case, and said support wall extends in the vertical direction.

19. The electric connection box according to claim 1, wherein the first suction port extends further in a lateral direction than any other direction and the second suction port extends further in a vertical direction than any other direction.

20. An automotive electric connection box for use in an automobile, comprising:

a circuit board having a first surface capable of mounting an electronic component, and a second surface defining a non-mounting surface;

a case housing the circuit board, the circuit board oriented in a substantially vertical direction;

a vertical inner wall surface of the case formed opposite the second surface of said circuit board, the vertical inner wall surface and the second surface of said circuit board defining a substantially vertical air ventilation path;

a first suction port and a second suction port positioned in the case in communication with a bottom end of the ventilation path, wherein the first suction port is positioned in a bottom portion of the case and the second suction port is positioned in a lower side portion of the case and the first suction port and the second suction port are configured such that air that passes through the first suction port and air that separately passes through the second suction port converges before or in the ventilation path;

a first exhaust port and a second exhaust port positioned in the case in communication with a top end of the ventilation path and in an upper side portion of the case, the first exhaust port laterally penetrating the vertical inner wall surface of the case, the second exhaust port laterally penetrating the case opposite the first exhaust port with respect to the ventilation path, and each of the first exhaust port and the second exhaust port having an opening area larger than an opening area of each of the first suction port and the second suction port;

a bulged section provided on the case, the first suction port is positioned on a bottom surface of the bulged section and the second suction port is positioned on a side surface of the bulged section; and a heat generating component positioned in the bulged section and between the plurality of suction ports and the bottom end of the ventilation path, wherein the automotive electric connection box controls on-vehicle electrical components; and air flow through the air ventilation path is created by natural convection.

* * * * *